(12) United States Patent
Itokazu et al.

(10) Patent No.: US 11,830,790 B2
(45) Date of Patent: Nov. 28, 2023

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Hiroko Itokazu, Kawasaki Kanagawa (JP); Tomoko Matsudai, Tokyo (JP); Yoko Iwakaji, Tokyo (JP); Keiko Kawamura, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 251 days.

(21) Appl. No.: 17/472,020

(22) Filed: Sep. 10, 2021

(65) Prior Publication Data
US 2022/0301982 A1   Sep. 22, 2022

(30) Foreign Application Priority Data
Mar. 22, 2021   (JP) ................. 2021-047617

(51) Int. Cl.
*H01L 23/482*   (2006.01)
*H01L 29/739*   (2006.01)

(52) U.S. Cl.
CPC ...... *H01L 23/4824* (2013.01); *H01L 29/7397* (2013.01)

(58) Field of Classification Search
CPC .............. H01L 23/4824; H01L 29/7397
USPC ................................................ 257/139
See application file for complete search history.

(56) References Cited

U.S. PATENT DOCUMENTS

| | | | |
|---|---|---|---|
| 6,653,740 B2 | 11/2003 | Kinzer et al. | |
| 2017/0271451 A1 | 9/2017 | Matsushita et al. | |
| 2018/0308757 A1 | 10/2018 | Kakimoto | |
| 2019/0296133 A1 | 9/2019 | Iwakaji et al. | |
| 2020/0091326 A1* | 3/2020 | Iwakaji ............... H01L 29/1004 | |

FOREIGN PATENT DOCUMENTS

| | | |
|---|---|---|
| JP | H02-5483 A | 1/1990 |
| JP | 2003-209122 A | 7/2003 |
| JP | 2007-234850 A | 9/2007 |
| JP | 2010-109545 A | 5/2010 |
| JP | 4646284 B2 | 3/2011 |
| JP | 2019-169597 A | 10/2019 |

* cited by examiner

*Primary Examiner* — Igwe U Anya
(74) *Attorney, Agent, or Firm* — Allen & Overy LLP

(57) ABSTRACT

A semiconductor device according to an embodiment includes: a first trench and a second trench extending in a first direction; a first gate electrode in the first trench; a second gate electrode in the second trench; a first gate wire including a first portion extending in a second direction perpendicular to the first direction and a third portion extending in the second direction; a second gate wire including a first portion extending in the second direction and a third portion extending in the second direction; a first gate electrode pad; and a second gate electrode pad. The first portion of the second gate wire is between the first portion and the third portion of the first gate wire, and the third portion of the first gate wire is between the first portion and the third portion of the second gate wire.

11 Claims, 16 Drawing Sheets

SEMICONDUCTOR DEVICE

CROSS-REFERENCE TO RELATED APPLICATION

This application is based upon and claims the benefit of priority from Japanese Patent Application No. 2021-047617, filed on Mar. 22, 2021, the entire contents of which are incorporated herein by reference.

FIELD

Embodiments described herein relate generally to a semiconductor device.

BACKGROUND

As an example of a power semiconductor device, there is an insulated gate bipolar transistor (IGBT). In the IGBT, for example, a p-type collector region, an n-type drift region, and a p-type base region are provided on a collector electrode. Further, a gate electrode is provided in a trench penetrating the p-type base region and reaching the n-type drift region with a gate insulating film interposed therebetween. Furthermore, an n-type emitter region connected to an emitter electrode is provided in a region adjacent to the trench on a surface of the p-type base region.

In the IGBT, a positive voltage equal to or more than a threshold voltage is applied to the gate electrode, so that a channel is formed in the p-type base region. Then, electrons are injected from the n-type emitter region into the n-type drift region, and holes are injected from the collector region into the n-type drift region at the same time. As a result, a current using electrons and holes as carriers flows between the collector electrode and the emitter electrode.

In the IGBT, it is desired to achieve both reduction in on-resistance and reduction in switching loss. In order to achieve both reduction in on-resistance and reduction in switching loss, an IGBT for driving a plurality of gates independently of each other has been proposed. This technology changes driving timings of the plurality of gates, thereby shortening switching time of the IGBT and reducing switching loss.

DETAILED DESCRIPTION

Figure 1:
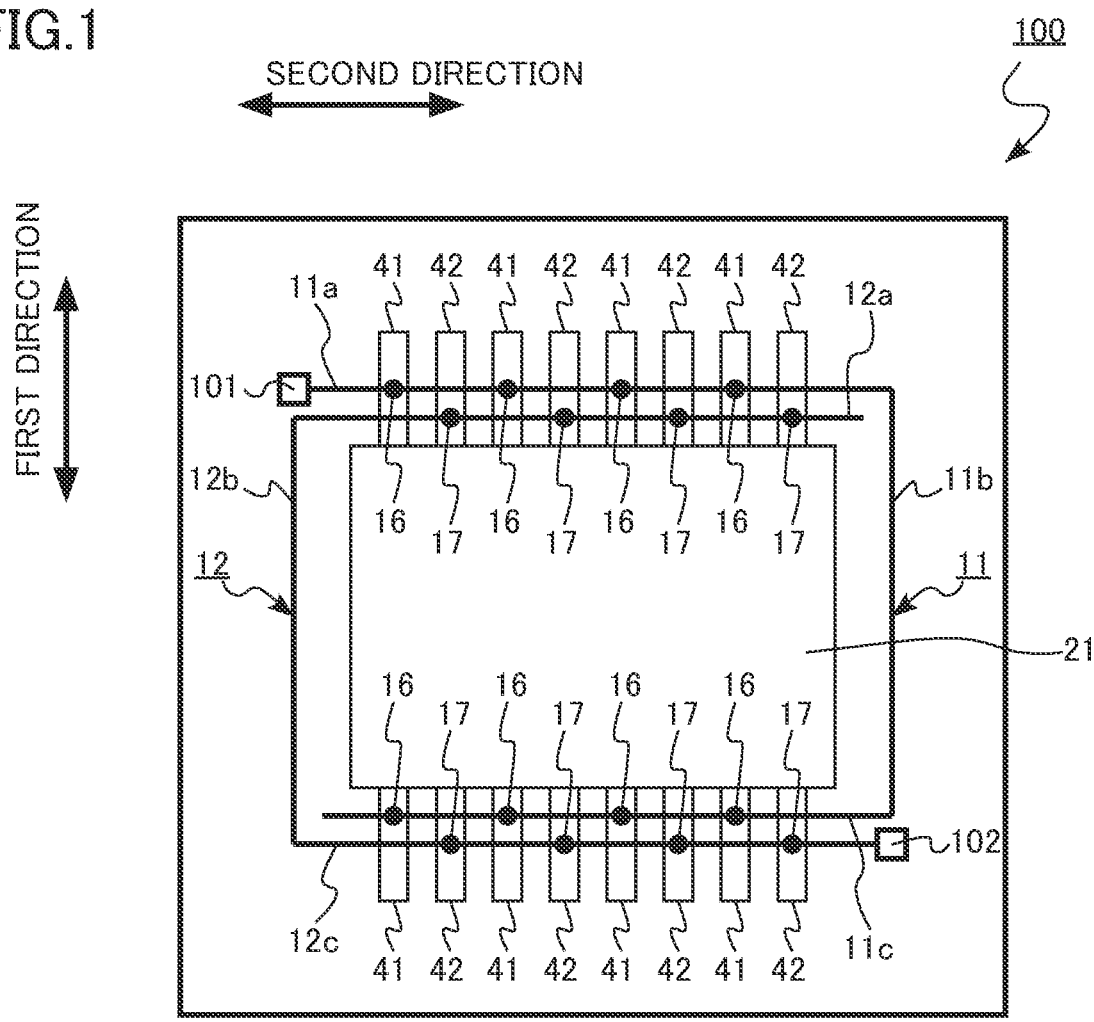
FIG. 1 is a schematic diagram of a semiconductor device according to a first embodiment.

A semiconductor device according to an embodiment includes: a semiconductor layer having a first plane and a second plane facing the first plane, the semiconductor layer including a plurality of first trenches and a plurality of second trenches, the first trenches being provided in a first plane side and extending in a first direction parallel to the first plane, the second trenches being provided in the first plane side and extending in the first direction, and at least one of the second trenches being provided between the first trenches; a first electrode provided on the first plane side of the semiconductor layer; a second electrode provided on a second plane side of the semiconductor layer; first gate electrodes provided in the first trenches; second gate electrodes provided in the second trenches; a first gate wire provided on the first plane side of the semiconductor layer, the first gate wire including a first portion extending in a second direction parallel to the first plane and perpendicular to the first direction, a second portion extending in the first direction, and a third portion extending in the second direction, and the first gate wire being electrically connected to the first gate electrodes; a second gate wire provided on the first plane side of the semiconductor layer, the second gate wire including a first portion extending in the second direction, a second portion extending in the first direction, and a third portion extending in the second direction, and the second gate wire being electrically connected to the second gate electrodes; a first gate electrode pad provided on the first plane side of the semiconductor layer and electrically connected to the first gate wire; and a second gate electrode pad provided on the first plane side of the semiconductor layer and electrically connected to the second gate wire. The first portion of the second gate wire is provided between the first portion of the first gate wire and the third portion of the first gate wire, and the third portion of the first gate wire is provided between the first portion of the second gate wire and the third portion of the second gate wire.

Hereinafter, embodiments of the present disclosure will be described with reference to the drawings. In the following description, the same or similar members are denoted by the same reference numerals and the description of the members described once is appropriately omitted.

In the present specification, when there are notations of an $n^+$ type, an n type, and an $n^-$ type, it means that the impurity concentration of the n type decreases in the order of the $n^+$ type, the n type, and the $n^-$ type. In addition, when there are notations of a $p^+$ type, a p type, and a $p^-$ type, it means that the impurity concentration of the p type decreases in the order of the $p^+$ type, the p type, and the $p^-$ type.

First Embodiment

A semiconductor device according to a first embodiment includes: a semiconductor layer having a first plane and a second plane facing the first plane, the semiconductor layer including a plurality of first trenches and a plurality of second trenches, the first trenches being provided in a first plane side and extending in a first direction parallel to the first plane, the second trenches being provided in the first plane side and extending in the first direction, and at least one of the second trenches being provided between the first trenches; a first electrode provided on the first plane side of the semiconductor layer; a second electrode provided on a second plane side of the semiconductor layer; first gate electrodes provided in the first trenches; second gate electrodes provided in the second trenches; a first gate wire provided on the first plane side of the semiconductor layer, the first gate wire including a first portion extending in a second direction parallel to the first plane and perpendicular to the first direction, a second portion extending in the first direction, and a third portion extending in the second direction, and the first gate wire being electrically connected to the first gate electrodes; a second gate wire provided on the first plane side of the semiconductor layer, the second gate wire including a first portion extending in the second direction, a second portion extending in the first direction, and a third portion extending in the second direction, and the second gate wire being electrically connected to the second gate electrodes; a first gate electrode pad provided on the first plane side of the semiconductor layer and electrically connected to the first gate wire; and a second gate electrode pad provided on the first plane side of the semiconductor layer and electrically connected to the second gate wire. The first portion of the second gate wire is provided between the first portion of the first gate wire and the third portion of the first gate wire, and the third portion of the first gate wire is provided between the first portion of the second gate wire and the third portion of the second gate wire.

The semiconductor device of the first embodiment is a trench gate type IGBT 100 including a gate electrode in a trench formed in a semiconductor layer. The IGBT 100 is an IGBT having two gates independently controllable and capable of double gate driving.

FIG. 1 is a schematic diagram of the semiconductor device according to the first embodiment. FIG. 1 illustrates an arrangement and a connection relation of a first trench, a second trench, a first gate wire, a second gate wire, a first contact portion, a second contact portion, an emitter electrode, a first gate electrode pad, and a second gate electrode pad.

Figure 2:
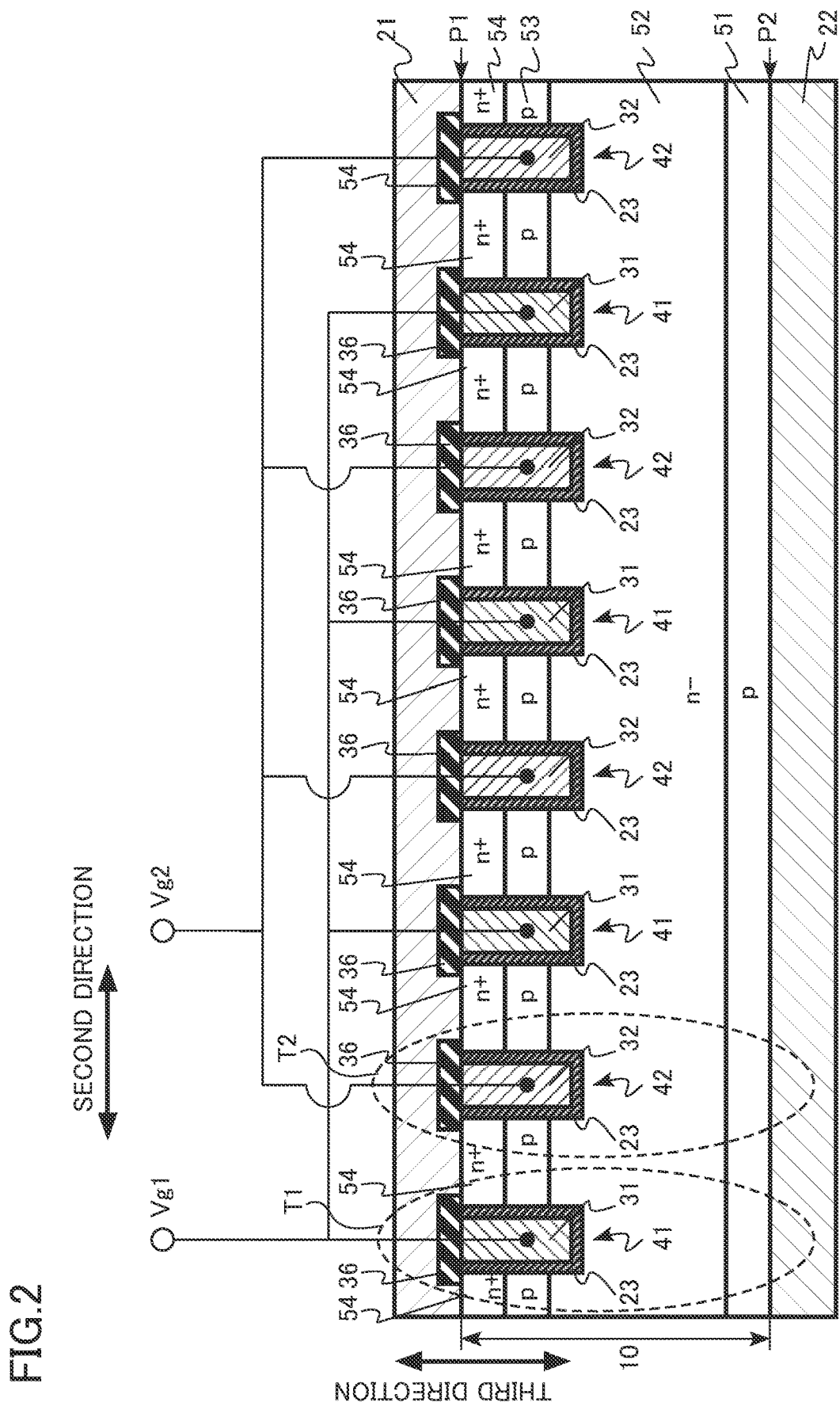
FIG. 2 is a schematic cross-sectional view of the semiconductor device according to the first embodiment.

FIG. 2 is a schematic cross-sectional view of the semiconductor device according to the first embodiment. FIG. 2 illustrates a cross section including the emitter electrode.

Figure 3:
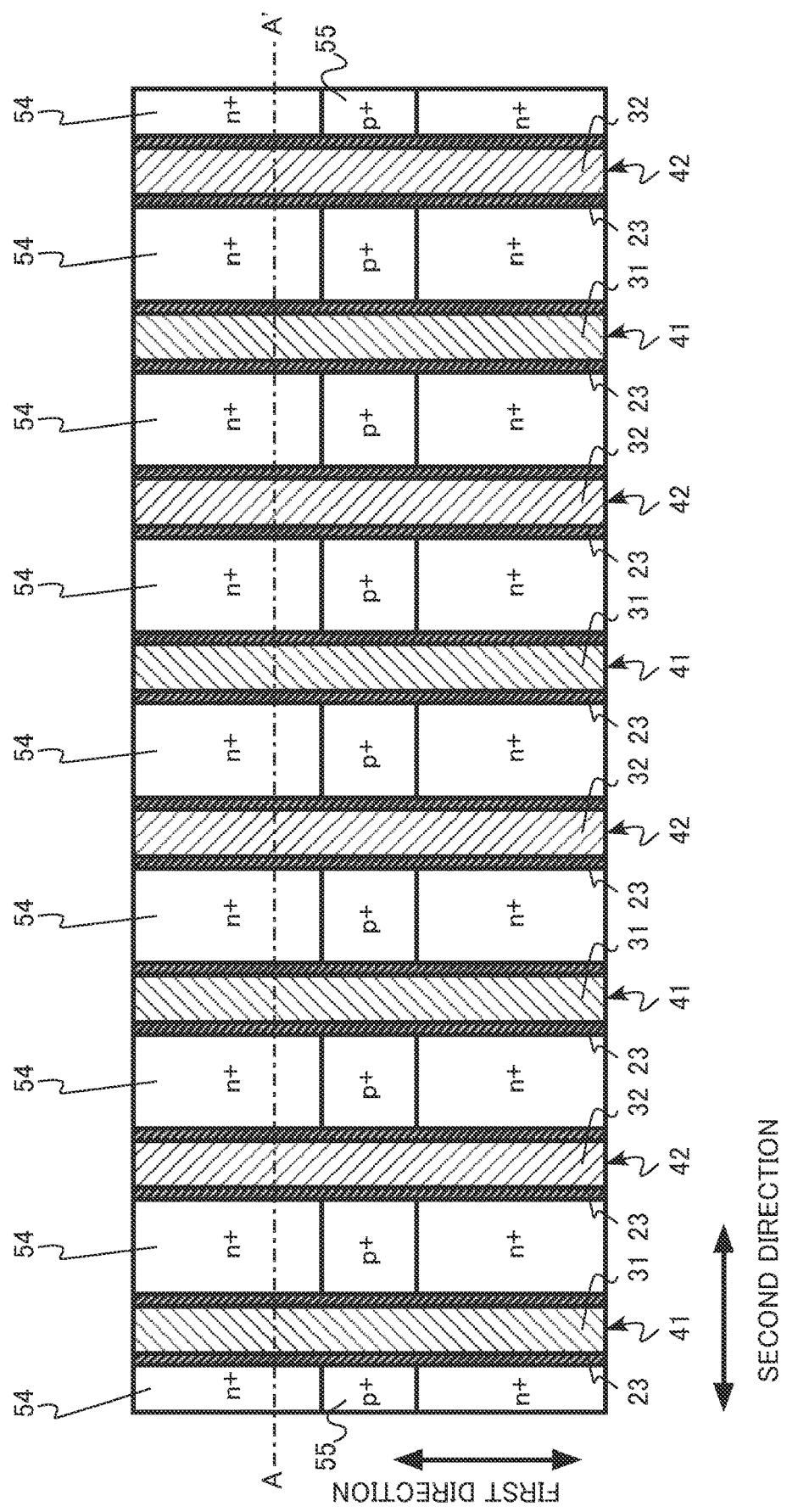
FIG. 3 is a schematic top view of the semiconductor device according to the first embodiment.

FIG. 3 is a schematic top view of the semiconductor device according to the first embodiment. FIG. 3 is a top view of a first plane P1. FIG. 2 is a cross-sectional view taken along the line AA' of FIG. 3.

Figure 4:
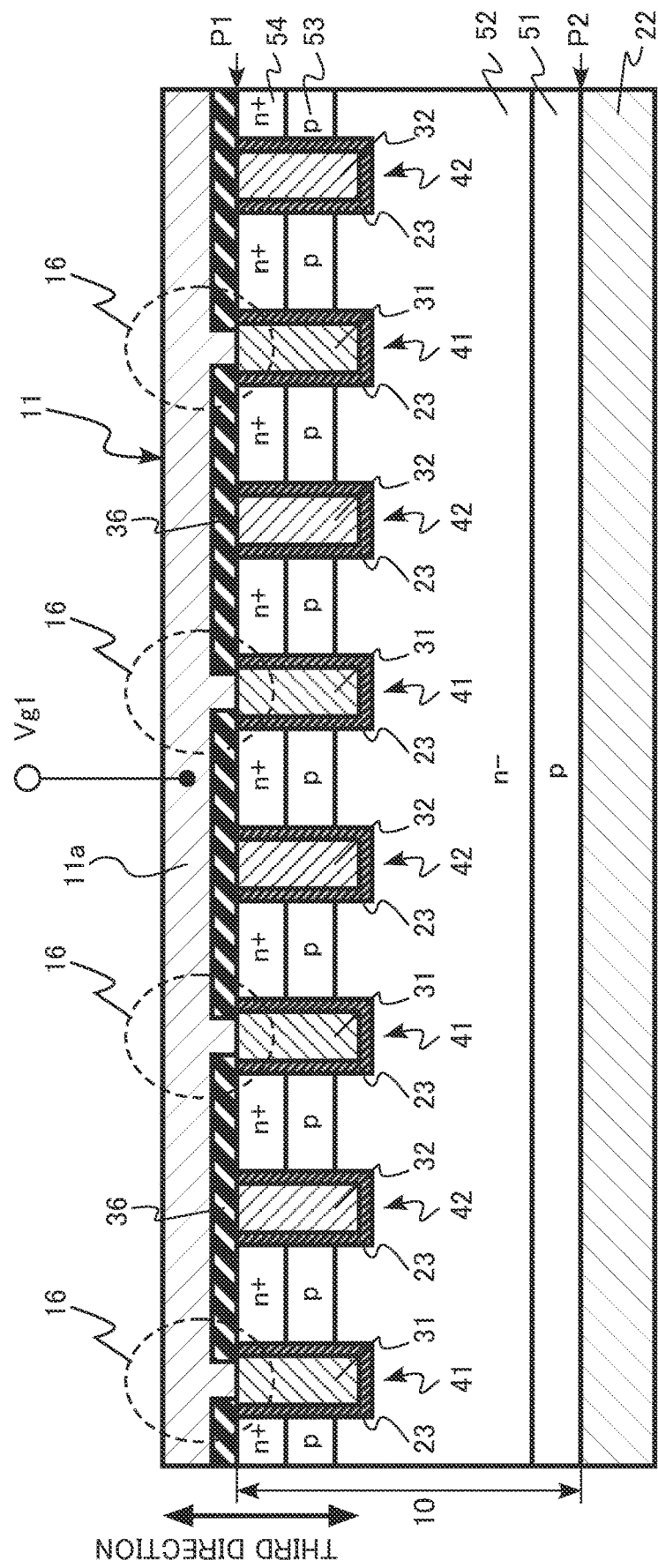
FIG. 4 is a schematic cross-sectional view of the semiconductor device according to the first embodiment.

FIG. 4 is a schematic cross-sectional view of the semiconductor device according to the first embodiment. FIG. 4 illustrates a cross section including the first gate wire and the first contact portion.

Figure 5:
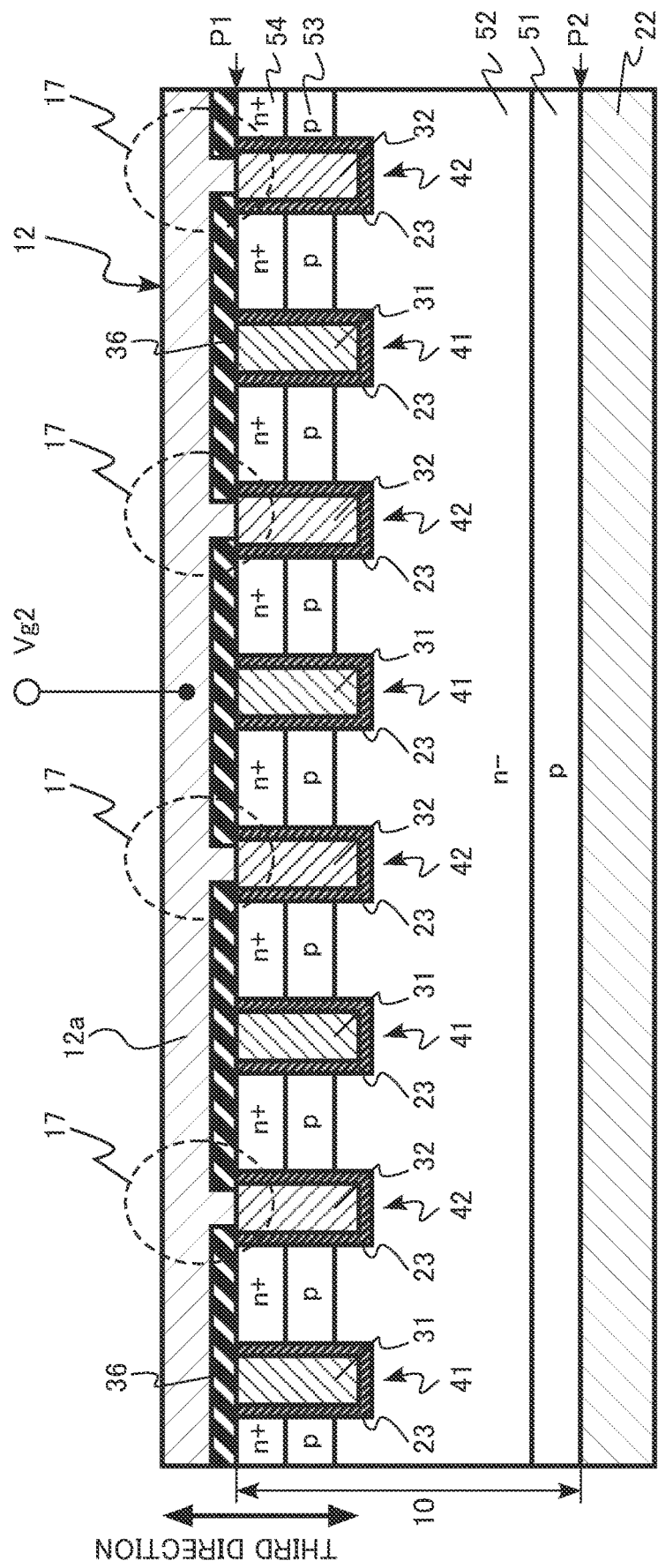
FIG. 5 is a schematic cross-sectional view of the semiconductor device according to the first embodiment.

FIG. 5 is a schematic cross-sectional view of the semiconductor device according to the first embodiment. FIG. 5 illustrates a cross section including the second gate wire and the second contact portion.

The IGBT 100 of the first embodiment includes a semiconductor layer 10, a first gate wire 11, a second gate wire 12, first contact portions 16, second contact portions 17, an emitter electrode 21 (first electrode), a collector electrode 22 (second electrode), a gate insulating film 23, first gate electrodes 31, second gate electrodes 32, an interlayer insulating layer 36, a first gate electrode pad 101, and a second gate electrode pad 102.

In the semiconductor layer 10, first gate trenches 41 (first trenches), second gate trenches 42 (second trenches), a collector region 51, a drift region 52, a base region 53, an emitter region 54, and a contact region 55 are provided.

The emitter electrode 21 is an example of a first electrode. The collector electrode 22 is an example of a second electrode. The first gate trench 41 is an example of the first trench. The second gate trench 42 is an example of the second trench.

The semiconductor layer 10 has a first plane P1 and a second plane P2 facing the first plane P1. The semiconductor layer 10 is, for example, single crystal silicon.

In the present specification, one direction parallel to the first plane P1 is referred to as a first direction. Further, a direction parallel to the first plane P1 and orthogonal to the first direction is referred to as a second direction. Further, a normal direction of the first plane P1 is referred to as a third direction.

The emitter electrode 21 is provided on the side of the first plane P1 of the semiconductor layer 10. At least a part of the emitter electrode 21 is in contact with the first plane P1 of the semiconductor layer 10. The emitter electrode 21 is, for example, a metal.

The emitter electrode 21 is electrically connected to the emitter region 54 and the contact region 55. An emitter voltage is applied to the emitter electrode 21. The emitter voltage is, for example, 0 V.

The collector electrode 22 is provided on the side of the second plane P2 of the semiconductor layer 10. At least a part of the collector electrode 22 is in contact with the second plane P2 of the semiconductor layer 10. The collector electrode 22 is, for example, a metal.

The collector electrode 22 is electrically connected to the p-type collector region 51. A collector voltage is applied to the collector electrode 22. The collector voltage is, for example, equal to or more than 200 V and equal to or less than 6500 V.

The collector region 51 is a p-type semiconductor region. The collector region 51 is electrically connected to the collector electrode 22. The collector region 51 functions as a supply source of holes when the IGBT 100 is in an on-state.

The drift region 52 is an n$^-$-type semiconductor region. The drift region 52 is provided between the collector region 51 and the first plane P1. The drift region 52 functions as a path of an on-current when the IGBT 100 is in an on-state. The drift region 52 has a function of being depleted when the IGBT 100 is in an off-state and maintaining a breakdown voltage of the IGBT 100.

The base region 53 is a p-type semiconductor region. The base region 53 is provided between the drift region 52 and the first plane P1. The base region 53 functions as a channel region of a transistor.

The emitter region 54 is an n$^+$-type semiconductor region. The emitter region 54 is provided between the base region 53 and the first plane P1. The emitter region 54 is electrically connected to the emitter electrode 21. The emitter region 54 is in contact with the emitter electrode 21. The emitter region 54 functions as a supply source of electrons when the transistor is in an on-state.

The contact region 55 is a p$^+$-type semiconductor region. The contact region 55 is provided between the base region 53 and the first plane P1. The contact region 55 is provided adjacent to or spaced from the emitter region 54. The contact region 55 is electrically connected to the emitter electrode 21.

A plurality of first gate trenches 41 are provided on the side of the first plane P1 of the semiconductor layer 10. As illustrated in FIG. 3, the first gate trench 41 extends in the first direction parallel to the first plane P1 on the first plane P1. The first gate trench 41 has a stripe shape. The plurality of first gate trenches 41 are repeatedly disposed in the second direction orthogonal to the first direction. The first gate trench 41 penetrates the base region 53 and reaches the drift region 52.

A plurality of second gate trenches 42 are provided in the side of the first plane P1 of the semiconductor layer 10. As illustrated in FIG. 3, the second gate trench 42 extends in the first direction parallel to the first plane P1 on the first plane P1. The second gate trench 42 has a stripe shape. The second gate trenches 42 are repeatedly disposed in the second direction orthogonal to the first direction. The second gate trench 42 is provided between the first gate trench 41 and the first gate trench 41. The second gate trench 42 penetrates the base region 53 and reaches the drift region 52.

The first gate electrode 31 is provided in the first gate trench 41. The first gate electrode 31 is, for example, a semiconductor or a metal. The first gate electrode 31 is, for example, amorphous silicon or polycrystalline silicon including n-type impurities or p-type impurities. The first gate electrode 31 is electrically connected to the first gate wire 11 and the first gate electrode pad 101.

The second gate electrode 32 is provided in the second gate trench 42. The second gate electrode 32 is, for example, a semiconductor or a metal. The second gate electrode 32 is, for example, amorphous silicon or polycrystalline silicon including n-type impurities or p-type impurities. The second gate electrode 32 is electrically connected to the second gate wire 12 and the second gate electrode pad 102.

The gate insulating film 23 is provided between the first gate electrode 31 and the semiconductor layer 10. The gate insulating film 23 is provided between the second gate electrode 32 and the semiconductor layer 10. The gate insulating film 23 is, for example, silicon oxide.

The interlayer insulating layer 36 is provided between the first gate electrode 31 and the emitter electrode 21. The interlayer insulating layer 36 electrically isolates the first gate electrode 31 and the emitter electrode 21 from each other. The interlayer insulating layer 36 is provided between the second gate electrode 32 and the emitter electrode 21. The interlayer insulating layer 36 electrically isolates the second gate electrode 32 and the emitter electrode 21 from each other. The interlayer insulating layer 36 is, for example, silicon oxide.

The first gate wire 11 is provided on the side of the first plane P1 of the semiconductor layer 10. The first gate wire 11 is electrically connected to the first gate electrode 31. The first gate wire 11 is electrically connected to the first gate electrode pad 101. The first gate wire 11 electrically connects the first gate electrode 31 and the first gate electrode pad 101.

The first gate wire 11 includes a first portion 11a, a second portion 11b, and a third portion 11c. The first portion 11a extends in the second direction. The second portion 11b extends in the first direction. The third portion 11c extends in the second direction.

The first portion 11a of the first gate wire 11 is connected to the first gate electrode 31 at the first contact portion 16 where the first portion 11a of the first gate wire 11 and the first gate trench 41 intersect. The first portion 11a is connected to the first gate electrode 31 via an opening formed in the interlayer insulating layer 36.

Similarly to the first portion 11a, the third portion 11c of the first gate wire 11 is connected to the first gate electrode 31 at the first contact portion 16 where the third portion 11c of the first gate wire 11 and the first gate trench 41 intersect. The third portion 11c is connected to the first gate electrode 31 via an opening formed in the interlayer insulating layer 36.

The first gate wire 11 is, for example, a metal. For example, the material of the first gate wire 11 and the material of the emitter electrode 21 are the same. The first gate wire 11 is formed by, for example, patterning the same metal layer as the emitter electrode 21.

The second gate wire 12 is provided on the side of the first plane P1 of the semiconductor layer 10. The second gate wire 12 is electrically connected to the second gate electrode 32. The second gate wire 12 is electrically connected to the second gate electrode pad 102. The second gate wire 12 electrically connects the second gate electrode 32 and the second gate electrode pad 102.

The second gate wire 12 includes a first portion 12a, a second portion 12b, and a third portion 12c. The first portion 12a extends in the second direction. The second portion 12b extends in the first direction. The third portion 12c extends in the second direction.

The first portion 12a of the second gate wire 12 is connected to the second gate electrode 32 at the second contact portion 17 where the first portion 12a of the second gate wire 12 and the second gate trench 42 intersect. The first portion 12a is connected to the second gate electrode 32 via an opening formed in the interlayer insulating layer 36.

Similarly to the first portion 12a, the third portion 12c of the second gate wire 12 is connected to the second gate electrode 32 at the second contact portion 17 where the third portion 12c of the second gate wire 12 and the second gate trench 42 intersect. The third portion 12c is connected to the second gate electrode 32 via an opening formed in the interlayer insulating layer 36.

The second gate wire 12 is, for example, a metal. For example, the material of the second gate wire 12 and the material of the emitter electrode 21 are the same. The second gate wire 12 is formed by, for example, patterning the same metal layer as the emitter electrode 21.

The first portion 12a of the second gate wire 12 is provided between the first portion 11a of the first gate wire 11 and the third portion 11c of the first gate wire 11. In addition, the third portion 11c of the first gate wire 11 is provided between the first portion 12a of the second gate wire 12 and the third portion 12c of the second gate wire 12.

The emitter electrode 21 is provided between the first portion 12a of the second gate wire 12 and the third portion 11c of the first gate wire 11. In addition, the emitter electrode 21 is provided between the second portion 11b of the first gate wire 11 and the second portion 12b of the second gate wire 12.

The first gate electrode pad 101 is provided on the side of the first plane P1 of the semiconductor layer 10. The first gate electrode pad 101 is connected to the first gate wire 11. The first gate electrode pad 101 is electrically connected to the first gate electrode 31 via the first gate wire 11.

A first gate voltage (Vg1) is applied to the first gate electrode pad 101. The first gate voltage (Vg1) is applied to the first gate wire 11 and the first gate electrode 31.

The first gate electrode pad 101 is, for example, a metal. For example, the material of the first gate electrode pad 101 and the material of the emitter electrode 21 are the same. The first gate electrode pad 101 is formed by, for example, patterning the same metal layer as the emitter electrode 21.

The second gate electrode pad 102 is provided on the side of the first plane P1 of the semiconductor layer 10. The second gate electrode pad 102 is connected to the second gate wire 12. The second gate electrode pad 102 is electrically connected to the second gate electrode 32 via the second gate wire 12.

A second gate voltage (Vg2) is applied to the second gate electrode pad 102. The second gate voltage (Vg2) is applied to the second gate wire 12 and the second gate electrode 32.

The second gate electrode pad 102 is, for example, a metal. For example, the material of the second gate electrode pad 102 and the material of the emitter electrode 21 are the same. The second gate electrode pad 102 is formed by, for example, patterning the same metal layer as the emitter electrode 21.

Next, functions and effects of the IGBT 100 of the first embodiment will be described.

The IGBT 100 of the first embodiment includes the first gate electrode 31 to which the first gate voltage (Vg1) is applied and the second gate electrode 32 to which the second gate voltage (Vg2) is applied. The IGBT 100 of the first embodiment includes a first transistor controlled by the first gate electrode 31 and a second transistor controlled by the second gate electrode 32. For example, a region surrounded by a broken line T1 in FIG. 2 corresponds to the first transistor. Further, for example, a region surrounded by a broken line T2 in FIG. 2 corresponds to the second transistor. By applying independent gate signals to the first transistor and the second transistor, the double gate driving can be realized. The IGBT 100 can achieve both the reduction in the on-resistance and the reduction in the switching loss by the double gate driving.

In order to perform the double gate driving, two gate electrode pads are required to apply two different gate voltages. In addition, two gate wires for connecting the respective gate electrode pads to the gate electrodes are required. For example, when a layout in which the two gate wires intersect with each other is adopted, an insulating layer for insulating the two gate wires vertically and a wiring layer for forming the gate wires to be added are newly required. When the insulating layer or the wiring layer is newly added, the manufacturing cost of the IGBT increases.

The IGBT 100 of the first embodiment adopts a layout in which the first gate wire 11 and the second gate wire 12 do not intersect with each other. The first gate wire 11 is connected to the first gate electrode 31 and the first gate electrode pad 101 without intersecting the second gate wire 12. In addition, the second gate wire 12 is connected to the second gate electrode pad 102 without intersecting the first gate wire 11.

The first gate wire 11 and the emitter electrode 21 are separated in the same plane. In addition, the second gate wire 12 and the emitter electrode 21 are separated in the same plane. Therefore, the first gate wire 11, the second gate wire 12, the first gate electrode pad 101, the second gate electrode pad 102, and the emitter electrode 21 can be formed by patterning the same metal layer. Accordingly, the double gate driving can be realized without increasing the manufacturing cost of the IGBT 100.

Further, in the IGBT 100 of the first embodiment, a part of the second gate wire 12 is provided between the first gate wires 11 provided with the emitter electrode 21 interposed therebetween. By adopting this layout, a difference between the distance between the two first contact portions 16 provided with the emitter electrode 21 interposed therebetween and the distance between the two second contact portions 17 provided with the emitter electrode 21 interposed therebetween can be reduced. For example, the distance between the two first contact portions 16 provided with the emitter electrode 21 interposed therebetween and the distance between the two second contact portions 17 provided with the emitter electrode 21 interposed therebetween can be equalized.

Therefore, a delay time of the gate signal caused by the resistance of the gate electrode can be almost equalized between the first transistor driven by the first gate electrode 31 and the second transistor driven by the second gate electrode 32. For example, a difference between a delay time of the gate signal of the first transistor at a position farthest from the first contact portion 16 and a delay time of the gate signal of the second transistor at a position farthest from the second contact portion 17 can be minimized. Therefore, deviations of the operation of the first transistor and the operation of the second transistor from desired operation timing can be minimized. In addition, a difference between a distance from the first contact portion 16 to the farthest first transistor and a distance from the second contact portion 17 to the farthest second transistor is reduced, so that, for example, the non-uniform operation due to the current concentration can be eliminated. Therefore, according to the IGBT 100, stable double gate driving can be realized.

As described above, according to the first embodiment, it is possible to provide an IGBT capable of realizing stable driving of a plurality of gates at low cost.

Second Embodiment

A semiconductor device according to a second embodiment is different from the semiconductor device according to the first embodiment in that a first gate wire further includes a fourth portion extending in a first direction and a fifth portion extending in a second direction, a second gate wire further includes a fourth portion extending in the first direction and a fifth portion extending in the second direction, a third portion of the second gate wire is provided between a third portion of the first gate wire and the fifth portion of the first gate wire, and the fifth portion of the first gate wire is provided between a third portion of the second gate wire and the fifth portion of the second gate wire. Hereinafter, description of contents overlapping with those of the first embodiment may be partially omitted.

The semiconductor device of the second embodiment is a trench gate type IGBT 200 including a gate electrode in a trench formed in a semiconductor layer. The IGBT 200 is an IGBT having two gates independently controllable and capable of double gate driving.

Figure 6:
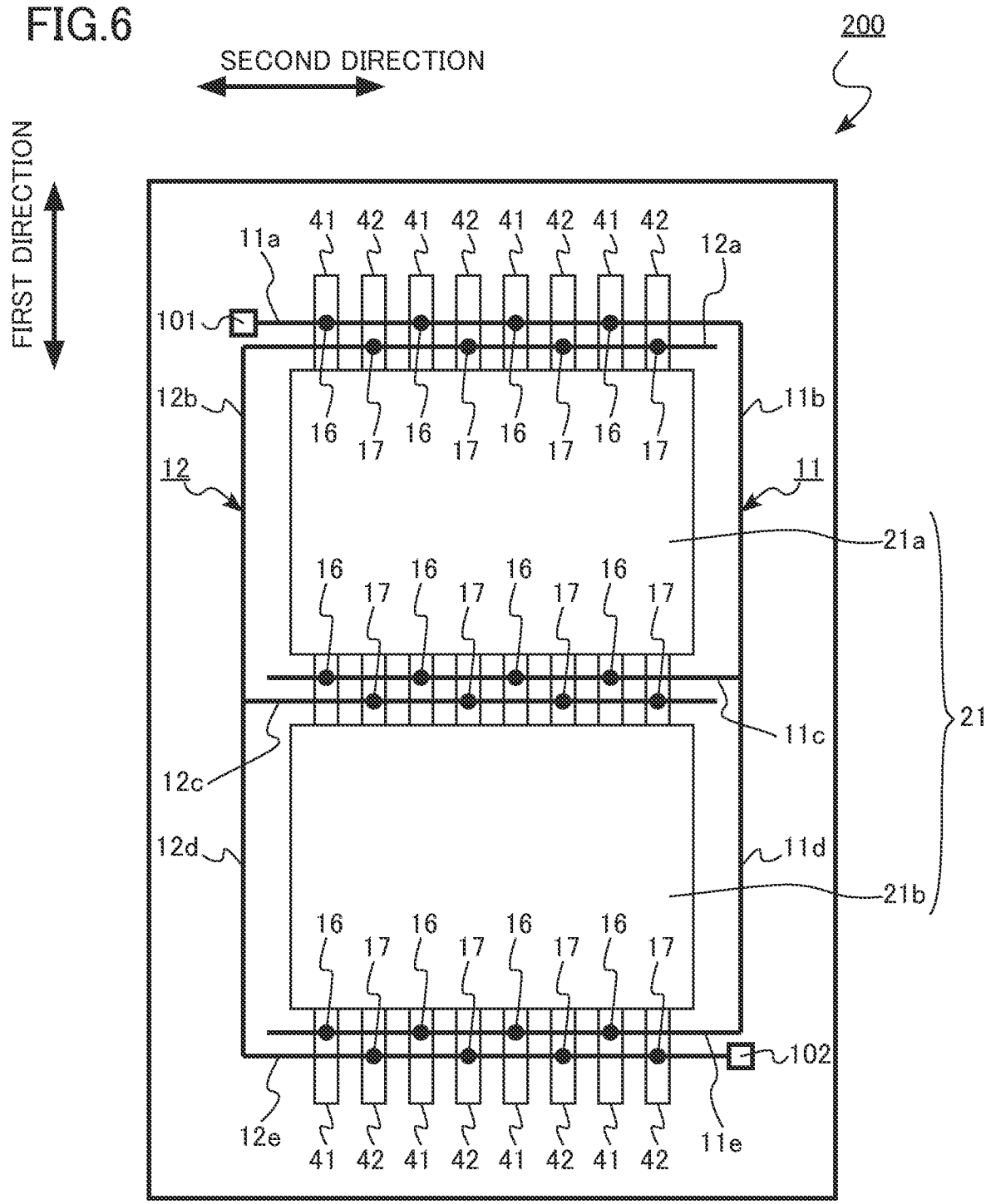
FIG. 6 is a schematic diagram of a semiconductor device according to a second embodiment.

FIG. 6 is a schematic diagram of the semiconductor device according to the second embodiment. FIG. 6 illustrates an arrangement and a connection relation of a first trench, a second trench, a first gate wire, a second gate wire, a first contact portion, a second contact portion, an emitter electrode, a first gate electrode pad, and a second gate electrode pad.

An emitter electrode 21 has a first region 21*a* and a second region 21*b*. The first region 21*a* and the second region 21*b* are spaced from each other in the first direction. The IGBT 200 has two transistor blocks of a transistor block including the first region 21*a* and a transistor block including the second region 21*b*.

A first gate wire 11 includes a first portion 11*a*, a second portion 11*b*, a third portion 11*c*, a fourth portion 11*d*, and a fifth portion 11*e*. The first portion 11*a* extends in the second direction. The second portion 11b extends in the first direction. The third portion 11c extends in the second direction. The fourth portion 11d extends in the first direction. The fifth portion 11e extends in the second direction.

The fifth portion 11e of the first gate wire 11 is connected to a first gate electrode 31 at a first contact portion 16 where the fifth portion 11e of the first gate wire 11 and a first gate trench 41 intersect. The fifth portion 11e is connected to the first gate electrode 31 via an opening formed in an interlayer insulating layer 36.

A second gate wire 12 includes a first portion 12a, a second portion 12b, a third portion 12c, a fourth portion 12d, and a fifth portion 12e. The first portion 12a extends in the second direction. The second portion 12b extends in the first direction. The third portion 12c extends in the second direction. The fourth portion 12d extends in the first direction. The fifth portion 12e extends in the second direction.

The fifth portion 12e of the second gate wire 12 is connected to a second gate electrode 32 at a second contact portion 17 where the fifth portion 12e of the second gate wire 12 and a second gate trench 42 intersect. The fifth portion 12e is connected to the second gate electrode 32 via an opening formed in the interlayer insulating layer 36.

The third portion 12c of the second gate wire 12 is provided between the third portion 11c of the first gate wire 11 and the fifth portion 11e of the first gate wire 11. In addition, the fifth portion 11e of the first gate wire 11 is provided between the third portion 12c of the second gate wire 12 and the fifth portion 12e of the second gate wire 12.

The first region 21a of the emitter electrode 21 is provided between the first portion 12a of the second gate wire 12 and the third portion 11c of the first gate wire 11. In addition, the first region 21a of the emitter electrode 21 is provided between the second portion 11b of the first gate wire 11 and the second portion 12b of the second gate wire 12.

The second region 21b of the emitter electrode 21 is provided between the third portion 12c of the second gate wire 12 and the fifth portion 11e of the first gate wire 11. In addition, the second region 21b of the emitter electrode 21 is provided between the fourth portion 11d of the first gate wire 11 and the fourth portion 12d of the second gate wire 12.

The IGBT 200 of the second embodiment includes two transistor blocks, and a contact portion for connecting a gate wire and a gate electrode is also provided between the two transistor blocks. Even when the contact portion is provided between the two transistor blocks, the IGBT 200 does not require an additional insulating layer or wiring layer.

Similarly to the IGBT 100 of the first embodiment, in the IGBT 200 of the second embodiment, the first gate wire 11, the second gate wire 12, a first gate electrode pad 101, a second gate electrode pad 102, and the emitter electrode 21 can be formed by patterning the same metal layer. Therefore, double gate driving can be realized without increasing the manufacturing cost of the IGBT 200.

In addition, similarly to the IGBT 100 of the first embodiment, in the IGBT 200 of the second embodiment, deviations of the operation of a first transistor and the operation of a second transistor from desired operation timing can be minimized. In addition, similarly to the IGBT 100 of the first embodiment, a difference between a distance from the first contact portion 16 to the farthest first transistor and a distance from the second contact portion 17 to the farthest second transistor is reduced, so that, for example, the non-uniform operation due to the current concentration can be eliminated. Therefore, stable double gate driving can be realized.

Figure 7:
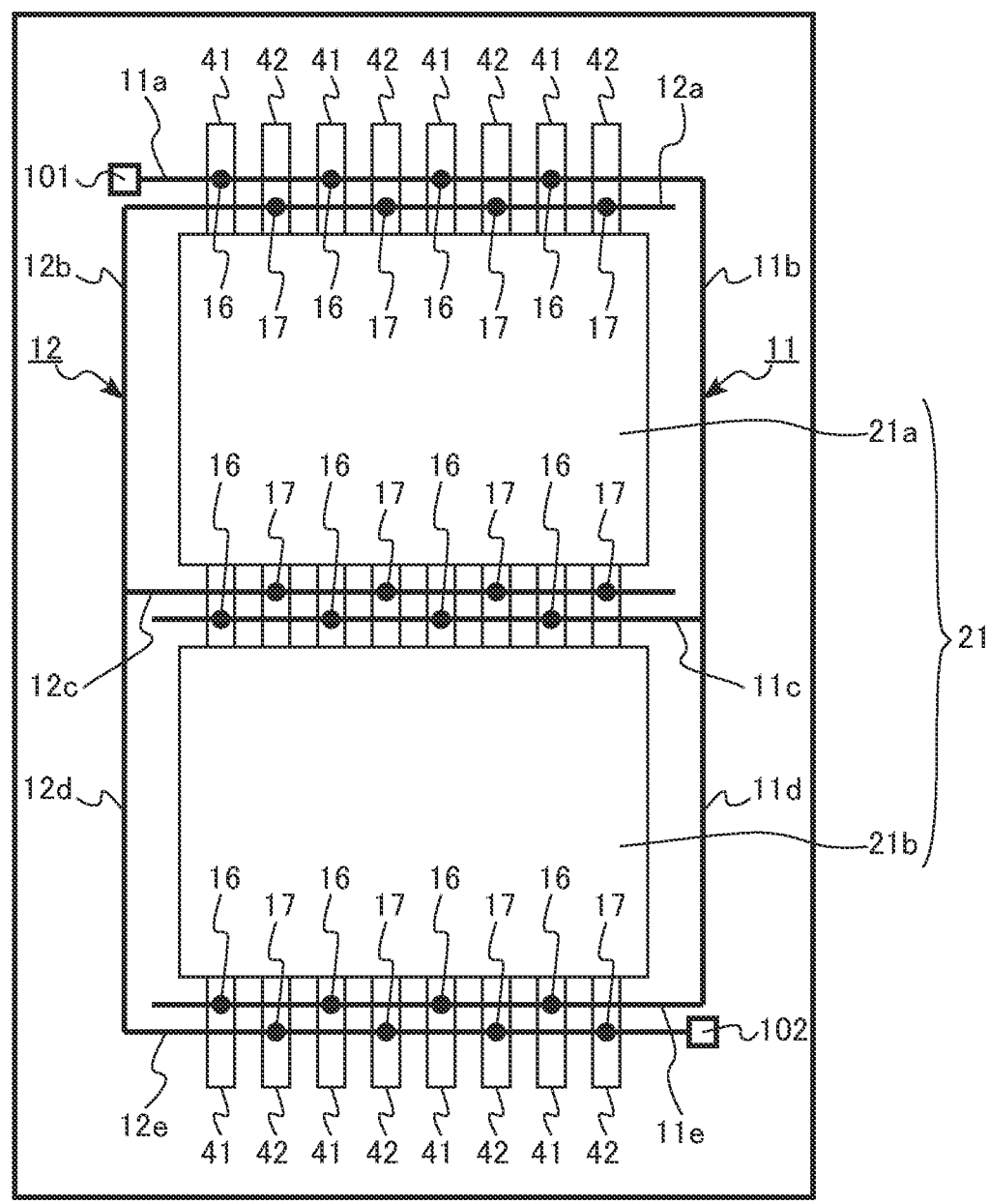
FIG. 7 is a schematic diagram of a semiconductor device according to a modification of the second embodiment.

FIG. 7 is a schematic diagram of a semiconductor device according to a modification of the second embodiment. An IGBT 201 of the modification is different from the IGBT 200 of the second embodiment in that the third portion 11c of the first gate wire 11 is provided between the third portion 12c of the second gate wire 12 and the fifth portion 11e of the first gate wire 11. In the IGBT 201 of the modification, a vertical relation between the third portion 11c of the first gate wire 11 and the third portion 12c of the second gate wire 12 is opposite to that of the IGBT 200.

As described above, according to the second embodiment and the modification thereof, it is possible to provide an IGBT capable of realizing stable driving of a plurality of gates at low cost.

Third Embodiment

A semiconductor device according to a third embodiment is different from the semiconductor device according to the first embodiment in that a semiconductor layer further includes a plurality of third trenches provided in the first plane side and extending in a first direction, the semiconductor device further includes third gate electrodes provided in the third trenches, a third gate wire including a first portion extending in a second direction, a second portion extending in the first direction, and a third portion extending in the second direction and electrically connected to the third gate electrode, and a third gate electrode pad provided on the side of the first plane of the semiconductor layer and electrically connected to the third gate wire. The first portion of the first gate wire is provided between the first portion of the third gate wire and the first portion of the second gate wire, and the third portion of the third gate wire is provided between the third portion of the first gate wire and the third portion of the second gate wire. Hereinafter, description of contents overlapping with those of the first embodiment may be partially omitted.

The semiconductor device of the third embodiment is a trench gate type IGBT 300 including a gate electrode in a trench formed in a semiconductor layer. The IGBT 300 is an IGBT having three gates independently controllable and capable of triple gate driving.

Figure 8:
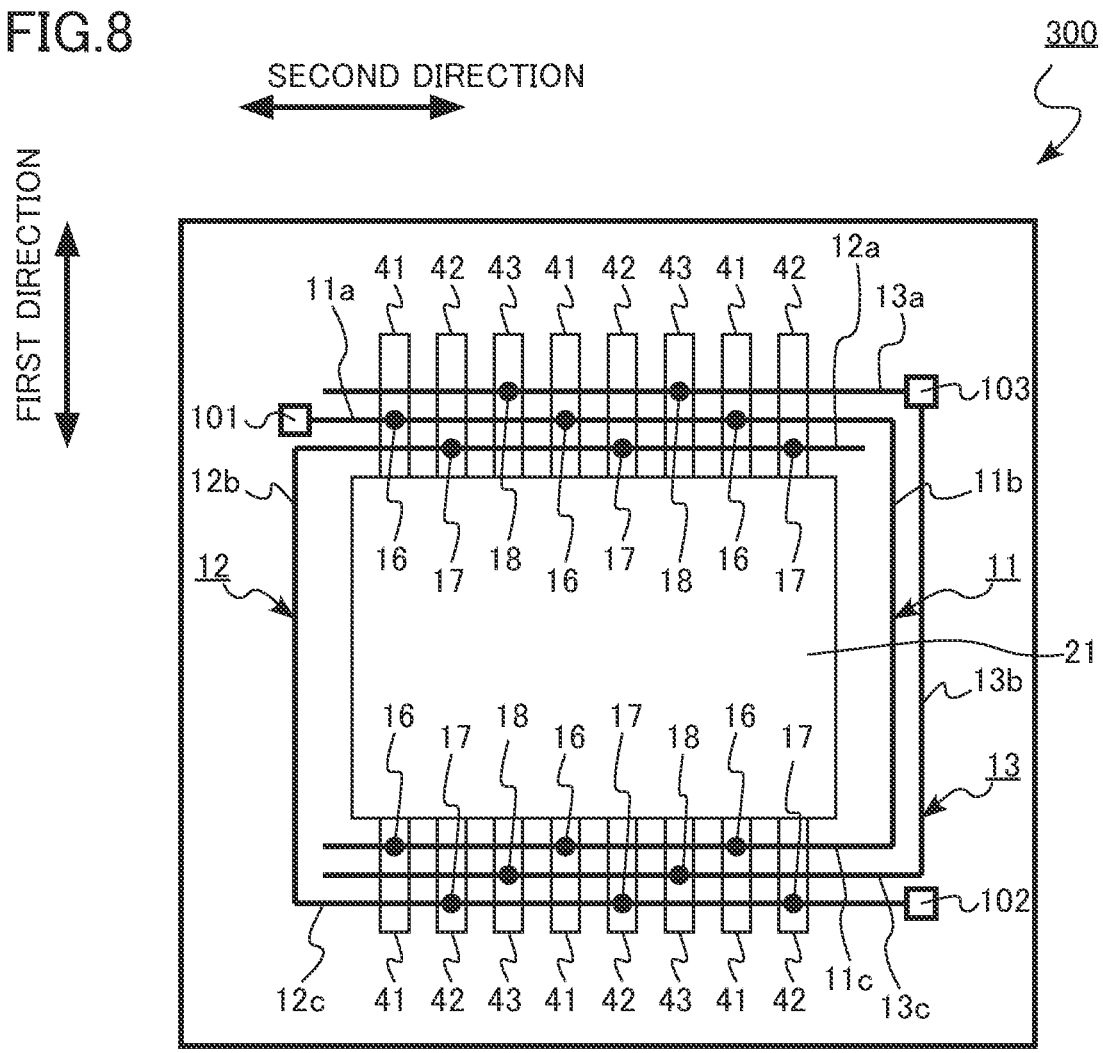
FIG. 8 is a schematic diagram of a semiconductor device according to a third embodiment.

FIG. 8 is a schematic diagram of the semiconductor device according to the third embodiment. FIG. 8 illustrates an arrangement and a connection relation of a first trench, a second trench, a third trench, a first gate wire, a second gate wire, a third gate wire, a first contact portion, a second contact portion, a third contact portion, an emitter electrode, a first gate electrode pad, a second gate electrode pad, and a third gate electrode pad.

Figure 9:
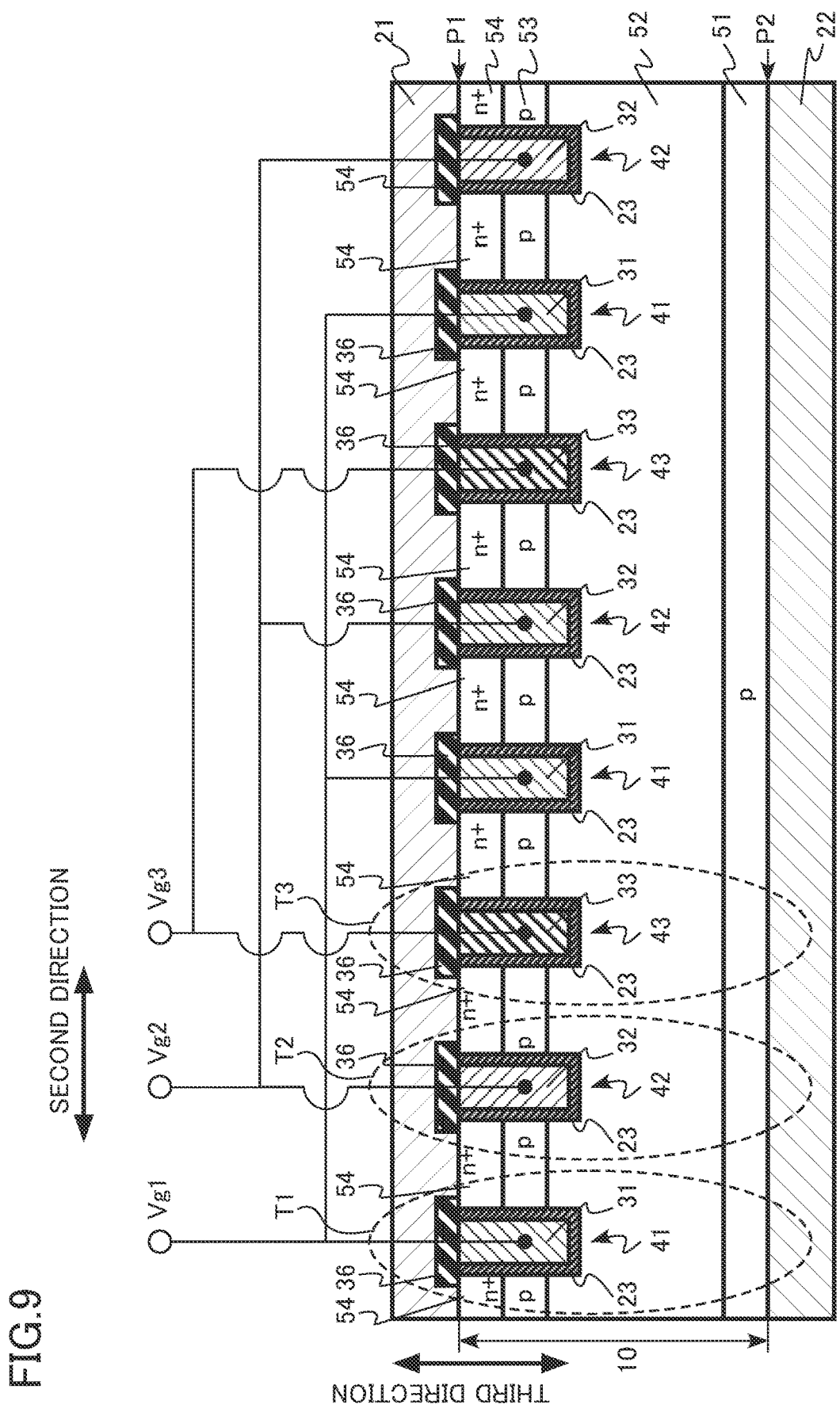
FIG. 9 is a schematic cross-sectional view of the semiconductor device according to the third embodiment.

FIG. 9 is a schematic cross-sectional view of the semiconductor device according to the third embodiment. FIG. 9 illustrates a cross section including the emitter electrode.

The IGBT 300 of the third embodiment includes a semiconductor layer 10, a first gate wire 11, a second gate wire 12, a third gate wire 13, first contact portions 16, second contact portions 17, third contact portions 18, an emitter electrode 21 (first electrode), a collector electrode 22 (second electrode), a gate insulating film 23, first gate electrodes 31, second gate electrodes 32, third gate electrodes 33, an interlayer insulating layer 36, a first gate electrode pad 101, a second gate electrode pad 102, and a third gate electrode pad 103.

In the semiconductor layer 10, first gate trenches 41 (first trenches), second gate trenches 42 (second trenches), third gate trenches 43 (third trenches), a collector region 51, a drift region 52, a base region 53, an emitter region 54, and a contact region 55 are provided.

The emitter electrode 21 is an example of a first electrode. The collector electrode 22 is an example of a second electrode. The first gate trench 41 is an example of the first trench. The second gate trench 42 is an example of the second trench. The third gate trench 43 is an example of the third trench.

A plurality of third gate trenches 43 are provided in the side of a first plane P1 of the semiconductor layer 10. The third gate trench 43 extends in the first direction parallel to the first plane P1 on the first plane P1. The third gate trench 43 has a stripe shape. The third gate trenches 43 are repeatedly disposed in the second direction orthogonal to the first direction. The third gate trench 43 is provided between the second gate trench 42 and the first gate trench 41. The third gate trench 43 penetrates the base region 53 and reaches the drift region 52.

The third gate electrode 33 is provided in the third gate trench 43. The third gate electrode 33 is, for example, a semiconductor or a metal. The third gate electrode 33 is, for example, amorphous silicon or polycrystalline silicon including n-type impurities or p-type impurities. The third gate electrode 33 is electrically connected to the third gate wire 13 and the third gate electrode pad 103.

The third gate wire 13 is provided on the side of the first plane P1 of the semiconductor layer 10. The third gate wire 13 is electrically connected to the third gate electrode 33. The third gate wire 13 is electrically connected to the third gate electrode pad 103. The third gate wire 13 electrically connects the third gate electrode 33 and the third gate electrode pad 103.

The third gate wire 13 includes a first portion 13a, a second portion 13b, and a third portion 13c. The first portion 13a extends in the second direction. The second portion 13b extends in the first direction. The third portion 13c extends in the second direction.

The first portion 13a of the third gate wire 13 is connected to the third gate electrode 33 at the third contact portion 18 where the first portion 13a of the third gate wire 13 and the third gate trench 43 intersect. The first portion 13a is connected to the third gate electrode 33 via an opening formed in the interlayer insulating layer 36.

Similarly to the first portion 13a, the third portion 13c of the third gate wire 13 is connected to the third gate electrode 33 at the third contact portion 18 where the third portion 13c of the third gate wire 13 and the third gate trench 43 intersect. The third portion 13c is connected to the third gate electrode 33 via an opening formed in the interlayer insulating layer 36.

The third gate wire 13 is, for example, a metal. For example, the material of the third gate wire 13 and the material of the emitter electrode 21 are the same. The third gate wire 13 is formed by, for example, patterning the same metal layer as the emitter electrode 21.

The first portion 11a of the first gate wire 11 is provided between the first portion 13a of the third gate wire 13 and the first portion 12a of the second gate wire 12. The third portion 13c of the third gate wire 13 is provided between the third portion 11c of the first gate wire 11 and the third portion 12c of the second gate wire 12.

The emitter electrode 21 is provided between the first portion 13a of the third gate wire 13 and the third portion 13c of the third gate wire 13. In addition, the emitter electrode 21 is provided between the second portion 13b of the third gate wire 13 and the second portion 12b of the second gate wire 12.

The third gate electrode pad 103 is provided on the side of the first plane P1 of the semiconductor layer 10. The third gate electrode pad 103 is connected to the third gate wire 13. The third gate electrode pad 103 is electrically connected to the third gate electrode 33 via the third gate wire 13.

A third gate voltage (Vg3) is applied to the third gate electrode pad 103. The third gate voltage (Vg3) is applied to the third gate wire 13 and the third gate electrode 33.

The third gate electrode pad 103 is, for example, a metal. For example, the material of the third gate electrode pad 103 and the material of the emitter electrode 21 are the same. The third gate electrode pad 103 is formed by, for example, patterning the same metal layer as the emitter electrode 21.

The IGBT 300 of the third embodiment includes the first gate electrode 31 to which the first gate voltage (Vg1) is applied, the second gate electrode 32 to which the second gate voltage (Vg2) is applied, and the third gate electrode 33 to which the third gate voltage (Vg3) is applied. The IGBT 300 of the third embodiment includes a first transistor controlled by the first gate electrode 31, a second transistor controlled by the second gate electrode 32, and a third transistor controlled by the third gate electrode 33. For example, a region surrounded by a broken line T1 in FIG. 9 corresponds to the first transistor. Further, for example, a region surrounded by a broken line T2 in FIG. 9 corresponds to the second transistor. Further, for example, a region surrounded by a broken line T3 in FIG. 9 corresponds to the third transistor. By applying independent gate signals to the first transistor, the second transistor, and the third transistor, triple gate driving can be realized. The IGBT 300 can achieve both the reduction in on-resistance and the reduction in switching loss by the triple gate driving.

In order to perform the triple gate driving, three gate electrode pads are required to apply three different gate voltages. In addition, three gate wires for connecting the respective gate electrode pads to the gate electrodes are required.

The IGBT 300 of the third embodiment adopts a layout in which the first gate wire 11, the second gate wire 12, and the third gate wire 13 do not intersect. Further, the first gate wire 11, the second gate wire 12, and the third gate wire 13 and the emitter electrode 21 are separated in the same plane. Therefore, the first gate wire 11, the second gate wire 12, the third gate wire 13, the first gate electrode pad 101, the second gate electrode pad 102, the third gate electrode pad 103, and the emitter electrode 21 can be formed by patterning the same metal layer. Accordingly, the triple gate driving can be realized without increasing the manufacturing cost of the IGBT 300.

Further, for the same reason as the IGBT 100 of the first embodiment, deviations of the operation of the first transistor, the operation of the second transistor, and the operation of the third transistor from desired operation timing can be minimized. In addition, a difference between a distance from the first contact portion 16 to the farthest first transistor, a distance from the second contact portion 17 to the farthest second transistor, and a distance from the third contact portion 18 to the farthest third transistor is reduced, so that, for example, the non-uniform operation due to the current concentration can be eliminated. Therefore, stable triple gate driving can be realized.

As described above, according to the third embodiment, it is possible to provide an IGBT capable of realizing stable driving of a plurality of gates at low cost.

Fourth Embodiment

A semiconductor device according to a fourth embodiment is different from the semiconductor device according to the third embodiment in that a semiconductor layer further includes a plurality of fourth trenches provided in the first plane side and extending in a first direction, the semiconductor device further includes fourth gate electrodes provided in the fourth trenches, a fourth gate wire including a first portion extending in a second direction, a second portion extending in the first direction, and a third portion extending in the second direction and electrically connected to the fourth gate electrode, and a fourth gate electrode pad provided on the side of the first plane of the semiconductor layer and electrically connected to the fourth gate wire. The first portion of the fourth gate wire is provided between the first portion of the first gate wire and the first portion of the second gate wire, and the third portion of the second gate wire is provided between the third portion of the third gate wire and the third portion of the fourth gate wire. Hereinafter, description of contents overlapping with those of the first or third embodiment may be partially omitted.

The semiconductor device of the fourth embodiment is a trench gate type IGBT 400 including a gate electrode in a trench formed in the semiconductor layer. The IGBT 400 is an IGBT having four gates independently controllable and capable of quad gate driving.

Figure 10:
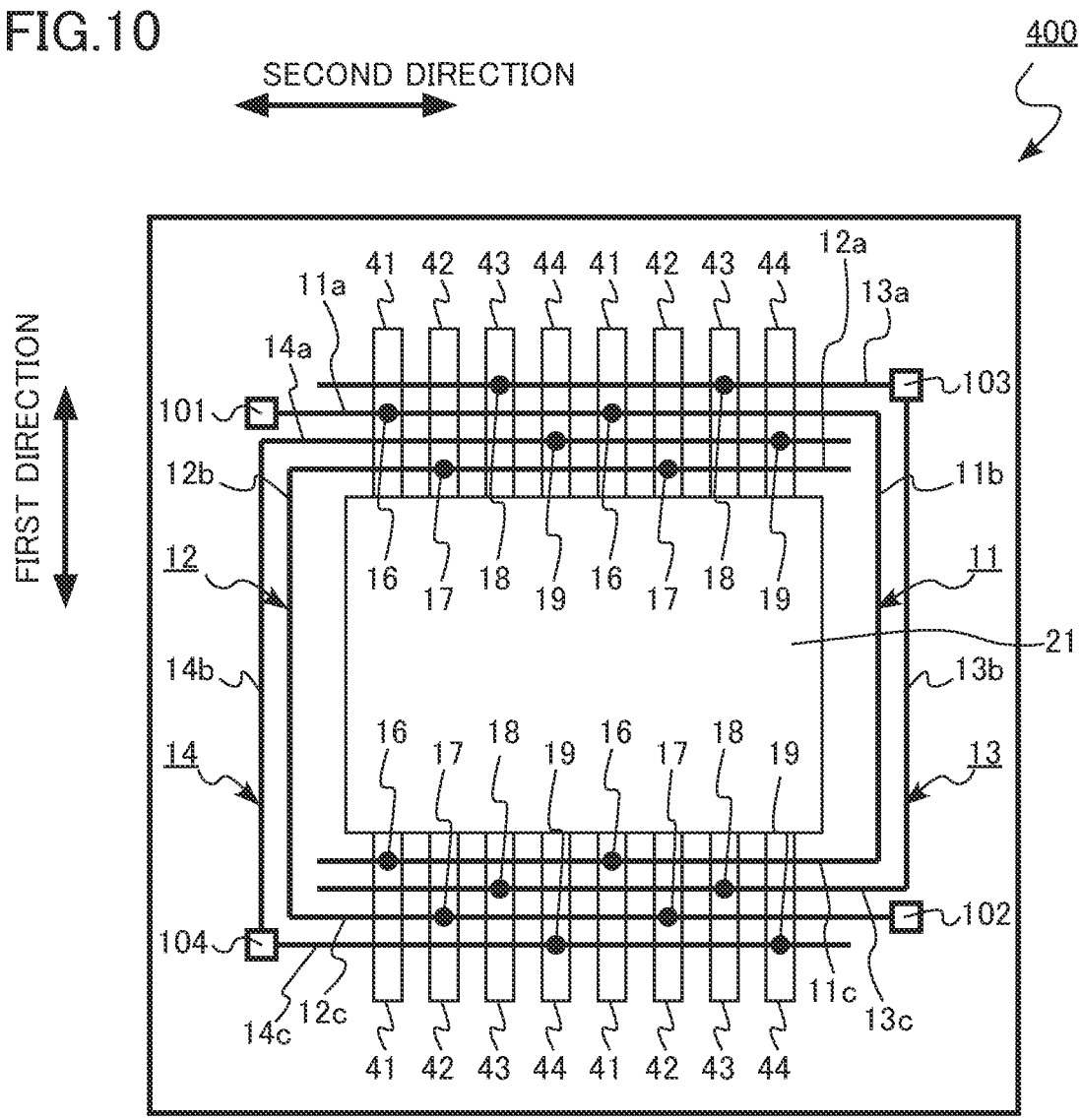
FIG. 10 is a schematic diagram of a semiconductor device according to a fourth embodiment.

FIG. 10 is a schematic diagram of the semiconductor device according to the fourth embodiment. FIG. 10 illustrates an arrangement and a connection relation of a first trench, a second trench, a third trench, a fourth trench, a first gate wire, a second gate wire, a third gate wire, a fourth gate wire, a first contact portion, a second contact portion, a third contact portion, a fourth contact portion, an emitter electrode, a first gate electrode pad, a second gate electrode pad, a third gate electrode pad, and a fourth gate electrode pad.

Figure 11:
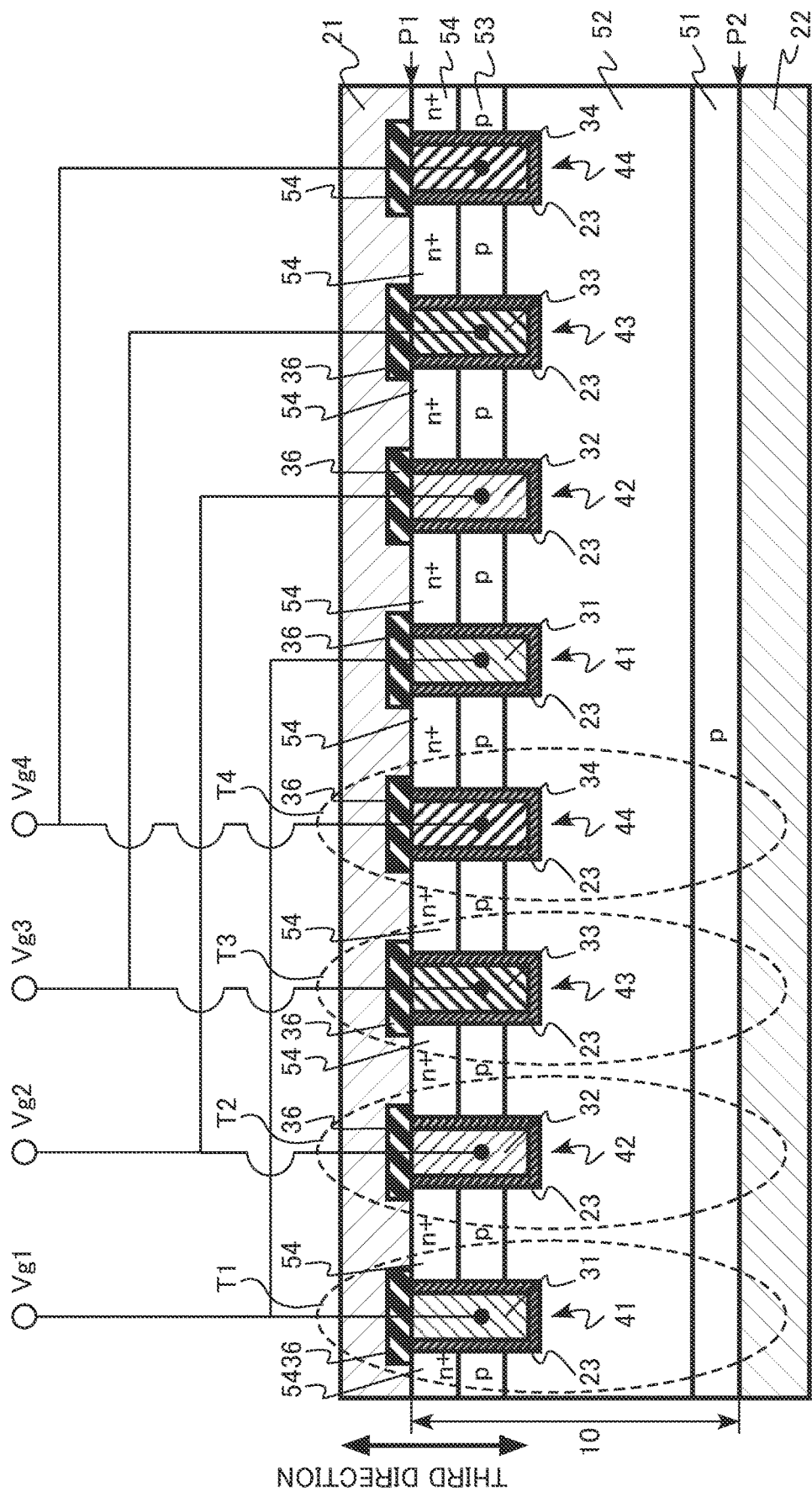
FIG. 11 is a schematic cross-sectional view of the semiconductor device according to the fourth embodiment.

FIG. 11 is a schematic cross-sectional view of the semiconductor device according to the fourth embodiment. FIG. 11 illustrates a cross section including the emitter electrode.

The IGBT 400 of the fourth embodiment includes a semiconductor layer 10, a first gate wire 11, a second gate wire 12, a third gate wire 13, a fourth gate wire 14, first contact portions 16, second contact portions 17, third contact portions 18, fourth contact portions 19, an emitter electrode 21 (first electrode), a collector electrode 22 (second electrode), a gate insulating film 23, first gate electrodes 31, second gate electrodes 32, third gate electrodes 33, fourth gate electrodes 34, an interlayer insulating layer 36, a first gate electrode pad 101, a second gate electrode pad 102, a third gate electrode pad 103, and a fourth gate electrode pad 104.

In the semiconductor layer 10, first gate trenches 41 (first trenches), second gate trenches 42 (second trenches), third gate trenches 43 (third trenches), fourth gate trenches 44 (fourth trenches), a collector region 51, a drift region 52, a base region 53, an emitter region 54, and a contact region 55 are provided.

The emitter electrode 21 is an example of a first electrode. The collector electrode 22 is an example of a second electrode. The first gate trench 41 is an example of the first trench. The second gate trench 42 is an example of the second trench. The third gate trench 43 is an example of the third trench. The fourth gate trench 44 is an example of the fourth trench.

A plurality of fourth gate trenches 44 are provided in the side of a first plane P1 of the semiconductor layer 10. The fourth gate trench 44 extends in the first direction parallel to the first plane P1 on the first plane P1. The fourth gate trench 44 has a stripe shape. The fourth gate trenches 44 are repeatedly disposed in the second direction orthogonal to the first direction. The fourth gate trench 44 is provided between the third gate trench 43 and the first gate trench 41. The fourth gate trench 44 penetrates the base region 53 and reaches the drift region 52.

The fourth gate electrode 34 is provided in the fourth gate trench 44. The fourth gate electrode 34 is, for example, a semiconductor or a metal. The fourth gate electrode 34 is, for example, amorphous silicon or polycrystalline silicon including n-type impurities or p-type impurities. The fourth gate electrode 34 is electrically connected to the fourth gate wire 14 and the fourth gate electrode pad 104.

The fourth gate wire 14 is provided on the side of the first plane P1 of the semiconductor layer 10. The fourth gate wire 14 is electrically connected to the fourth gate electrode 34. The fourth gate wire 14 is electrically connected to the fourth gate electrode pad 104. The fourth gate wire 14 electrically connects the fourth gate electrode 34 and the fourth gate electrode pad 104.

The fourth gate wire 14 includes a first portion 14*a*, a second portion 14*b*, and a third portion 14*c*. The first portion 14*a* extends in the second direction. The second portion 14*b* extends in the first direction. The third portion 14*c* extends in the second direction.

The first portion 14*a* of the fourth gate wire 14 is connected to the fourth gate electrode 34 at the fourth contact portion 19 where the first portion 14*a* of the fourth gate wire 14 and the fourth gate trench 44 intersect. The first portion 14*a* is connected to the fourth gate electrode 34 via an opening formed in the interlayer insulating layer 36.

Similarly to the first portion 14*a*, the third portion 14*c* of the fourth gate wire 14 is connected to the fourth gate electrode 34 at the fourth contact portion 19 where the third portion 14*c* of the fourth gate wire 14 and the fourth gate trench 44 intersect. The third portion 14*c* is connected to the fourth gate electrode 34 via an opening formed in the interlayer insulating layer 36.

The fourth gate wire 14 is, for example, a metal. For example, the material of the fourth gate wire 14 and the material of the emitter electrode 21 are the same. The fourth gate wire 14 is formed by, for example, patterning the same metal layer as the emitter electrode 21.

The first portion 14*a* of the fourth gate wire 14 is provided between the first portion 11*a* of the first gate wire 11 and the first portion 12*a* of the second gate wire 12. The third portion 12*c* of the second gate wire 12 is provided between the third portion 13*c* of the third gate wire 13 and the third portion 14*c* of the fourth gate wire 14.

The emitter electrode 21 is provided between the first portion 14*a* of the fourth gate wire 14 and the third portion 14*c* of the fourth gate wire 14. In addition, the emitter electrode 21 is provided between the second portion 14*b* of the fourth gate wire 14 and the second portion 11*b* of the first gate wire 11.

The fourth gate electrode pad 104 is provided on the side of the first plane P1 of the semiconductor layer 10. The fourth gate electrode pad 104 is connected to the fourth gate wire 14. The fourth gate electrode pad 104 is electrically connected to the fourth gate electrode 34 via the fourth gate wire 14.

A fourth gate voltage (Vg4) is applied to the fourth gate electrode pad 104. The fourth gate voltage (Vg4) is applied to the fourth gate wire 14 and the fourth gate electrode 34.

The fourth gate electrode pad 104 is, for example, a metal. For example, the material of the fourth gate electrode pad 104 and the material of the emitter electrode 21 are the same. The fourth gate electrode pad 104 is formed by, for example, patterning the same metal layer as the emitter electrode 21.

The IGBT 400 of the fourth embodiment includes the first gate electrode 31 to which the first gate voltage (Vg1) is applied, the second gate electrode 32 to which the second gate voltage (Vg2) is applied, the third gate electrode 33 to which the third gate voltage (Vg3) is applied, and the fourth gate electrode 34 to which the fourth gate voltage (Vg4) is applied. The IGBT 400 of the fourth embodiment includes a first transistor controlled by the first gate electrode 31, a second transistor controlled by the second gate electrode 32, a third transistor controlled by the third gate electrode 33, and a fourth transistor controlled by the fourth gate electrode 34. For example, a region surrounded by a broken line T1 in FIG. 11 corresponds to the first transistor. Further, for example, a region surrounded by a broken line T2 in FIG. 11 corresponds to the second transistor. Further, for example, a region surrounded by a broken line T3 in FIG. 11 corresponds to the third transistor. Further, for example, a region surrounded by a broken line T4 in FIG. 11 corresponds to the third transistor. By applying independent gate signals to the first transistor, the second transistor, the third transistor, and the fourth transistor, quad gate driving can be realized. The IGBT 400 can achieve both the reduction in on-resistance and the reduction in switching loss by the quad gate driving.

In order to perform the quad gate driving, four gate electrode pads are required to apply four different gate voltages. In addition, four gate wires for connecting the respective gate electrode pads to the gate electrodes are required.

The IGBT 400 of the fourth embodiment adopts a layout in which the first gate wire 11, the second gate wire 12, the third gate wire 13, and the fourth gate wire 14 do not intersect. Further, the first gate wire 11, the second gate wire 12, the third gate wire 13, and the fourth gate wire 14 and the emitter electrode 21 are separated in the same plane. Therefore, the first gate wire 11, the second gate wire 12, the third gate wire 13, the fourth gate wire 14, the first gate electrode pad 101, the second gate electrode pad 102, the third gate electrode pad 103, the fourth gate electrode pad 104, and the emitter electrode 21 can be formed by patterning the same metal layer. Accordingly, the quad gate driving can be realized without increasing the manufacturing cost of the IGBT 400.

Further, for the same reason as the IGBT 100 of the first embodiment, deviations of the operation of the first transistor, the operation of the second transistor, the operation of the third transistor, and the operation of the fourth transistor from desired operation timing can be minimized. In addition, a difference between a distance from the first contact portion 16 to the farthest first transistor, a distance from the second contact portion 17 to the farthest second transistor, a distance from the third contact portion 18 to the farthest third transistor, and a distance from the fourth contact portion 19 to the farthest fourth transistor is reduced, so that, for example, the non-uniform operation due to the current concentration can be eliminated. Therefore, stable quad gate driving can be realized.

As described above, according to the fourth embodiment, it is possible to provide an IGBT capable of realizing stable driving of a plurality of gates at low cost.

Fifth Embodiment

A semiconductor device of a fifth embodiment is different from the semiconductor device of the fourth embodiment in that a first electrode includes a first region and a second region, and the semiconductor device includes a transistor block including the first region and a transistor block including the second region. Further, the semiconductor device of the fifth embodiment is different from the semiconductor device of the second embodiment in that the semiconductor device includes a third gate wire and a fourth gate wire. Hereinafter, description of contents overlapping with those of the second or fourth embodiment may be partially omitted.

The semiconductor device of the fifth embodiment is a trench gate type IGBT 500 including a gate electrode in a trench formed in a semiconductor layer. The IGBT 500 is an IGBT having four gates independently controllable and capable of quad gate driving.

Figure 12:
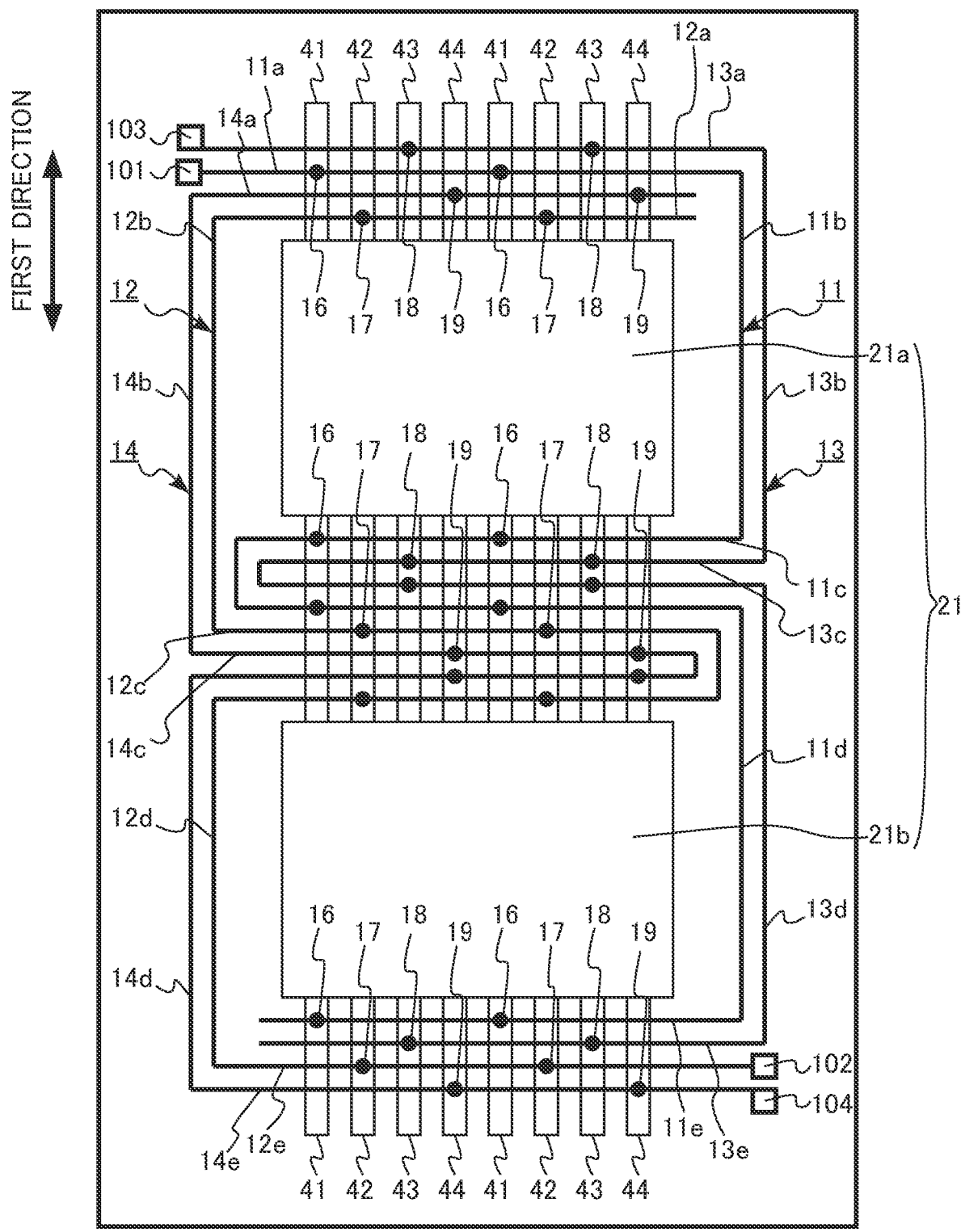
FIG. 12 is a schematic diagram of a semiconductor device according to a fifth embodiment.

FIG. 12 is a schematic diagram of the semiconductor device according to the fifth embodiment. FIG. 12 illustrates an arrangement and a connection relation of a first trench, a second trench, a third trench, a fourth trench, a first gate wire, a second gate wire, a third gate wire, a fourth gate wire, a first contact portion, a second contact portion, a third contact portion, a fourth contact portion, an emitter electrode, a first gate electrode pad, a second gate electrode pad, a third gate electrode pad, and a fourth gate electrode pad.

An emitter electrode 21 has a first region 21a and a second region 21b. The first region 21a and the second region 21b are spaced from each other in the first direction. The IGBT 500 has two transistor blocks of a transistor block including the first region 21a and a transistor block including the second region 21b.

A first gate wire 11 includes a first portion 11a, a second portion 11b, a third portion 11c, a fourth portion 11d, and a fifth portion 11e. The first portion 11a extends in the second direction. The second portion 11b extends in the first direction. The third portion 11c has a folded shape in which two portions extending in the second direction are connected by a portion extending in the first direction on one side. The fourth portion 11d extends in the first direction. The fifth portion 11e extends in the second direction.

The fifth portion 11e of the first gate wire 11 is connected to a first gate electrode 31 at a first contact portion 16 where the fifth portion 11e of the first gate wire 11 and a first gate trench 41 intersect. The fifth portion 11e is connected to the first gate electrode 31 via an opening formed in an interlayer insulating layer 36.

A second gate wire 12 includes a first portion 12a, a second portion 12b, a third portion 12c, a fourth portion 12d, and a fifth portion 12e. The first portion 12a extends in the second direction. The second portion 12b extends in the first direction. The third portion 12c has a folded shape in which two portions extending in the second direction are connected by a portion extending in the first direction on one side. The fourth portion 12d extends in the first direction. The fifth portion 12e extends in the second direction.

The fifth portion 12e of the second gate wire 12 is connected to a second gate electrode 32 at a second contact portion 17 where the fifth portion 12e of the second gate wire 12 and a second gate trench 42 intersect. The fifth portion 12e is connected to the second gate electrode 32 via an opening formed in the interlayer insulating layer 36.

The third gate wire 13 includes a first portion 13a, a second portion 13b, a third portion 13c, a fourth portion 13d, and a fifth portion 13e. The first portion 13a extends in the second direction. The second portion 13b extends in the first direction. The third portion 13c has a folded shape in which two portions extending in the second direction are connected by a portion extending in the first direction on one side. The fourth portion 13d extends in the first direction. The fifth portion 13e extends in the second direction.

The fifth portion 13e of the third gate wire 13 is connected to a third gate electrode 33 at a third contact portion 18 where the fifth portion 13e of the third gate wire 13 and a third gate trench 43 intersect. The fifth portion 13e is connected to the third gate electrode 33 via an opening formed in the interlayer insulating layer 36.

The fourth gate wire 14 includes a first portion 14a, a second portion 14b, a third portion 14c, a fourth portion 14d, and a fifth portion 14e. The first portion 14a extends in the second direction. The second portion 14b extends in the first direction. The third portion 14c has a folded shape in which two portions extending in the second direction are connected by a portion extending in the first direction on one side. The fourth portion 14d extends in the first direction. The fifth portion 14e extends in the second direction.

The fifth portion 14e of the fourth gate wire 14 is connected to a fourth gate electrode 34 at a fourth contact portion 19 where the fifth portion 14e of the fourth gate wire 14 and a fourth gate trench 44 intersect. The fifth portion 14e is connected to the fourth gate electrode 34 via an opening formed in the interlayer insulating layer 36.

The third portion 14c of the fourth gate wire 14 is provided between the third portion 13c of the third gate wire 13 and the fifth portion 13e of the third gate wire 13. In addition, the fifth portion 13e of the third gate wire 13 is provided between the third portion 14c of the fourth gate wire 14 and the fifth portion 14e of the fourth gate wire 14.

The first region 21a of the emitter electrode 21 is provided between the first portion 14a of the fourth gate wire 14 and the third portion 13c of the third gate wire 13. In addition, the first region 21a of the emitter electrode 21 is provided between the second portion 13b of the third gate wire 13 and the second portion 14b of the fourth gate wire 14.

The second region 21b of the emitter electrode 21 is provided between the third portion 14c of the fourth gate wire 14 and the fifth portion 13e of the third gate wire 13. In addition, the second region 21b of the emitter electrode 21 is provided between the fourth portion 13d of the third gate wire 13 and the fourth portion 14d of the fourth gate wire 14.

The IGBT 500 of the fifth embodiment includes two transistor blocks, and a contact portion for connecting a gate wire and a gate electrode is also provided between the two transistor blocks. Even when the contact portion is provided between the two transistor blocks, the IGBT 500 does not require an additional insulating layer or wiring layer.

Similarly to the IGBT 400 of the fourth embodiment, in the IGBT 500 of the fifth embodiment, the first gate wire 11, the second gate wire 12, a first gate electrode pad 101, a second gate electrode pad 102, and the emitter electrode 21 can be formed by patterning the same metal layer. Accordingly, the quad gate driving can be realized without increasing the manufacturing cost of the IGBT 500.

In addition, similarly to the IGBT 400 of the fourth embodiment, deviations of the operation of the first transistor, the operation of the second transistor, the operation of the third transistor, and the operation of the fourth transistor from desired operation timing can be minimized. In addition, a difference between a distance from the first contact portion 16 to the farthest first transistor, a distance from the second contact portion 17 to the farthest second transistor, a distance from the third contact portion 18 to the farthest third transistor, and a distance from the fourth contact portion 19 to the farthest fourth transistor is reduced, so that, for example, the non-uniform operation due to the current concentration can be eliminated. Therefore, stable quad gate driving can be realized.

Figure 13:
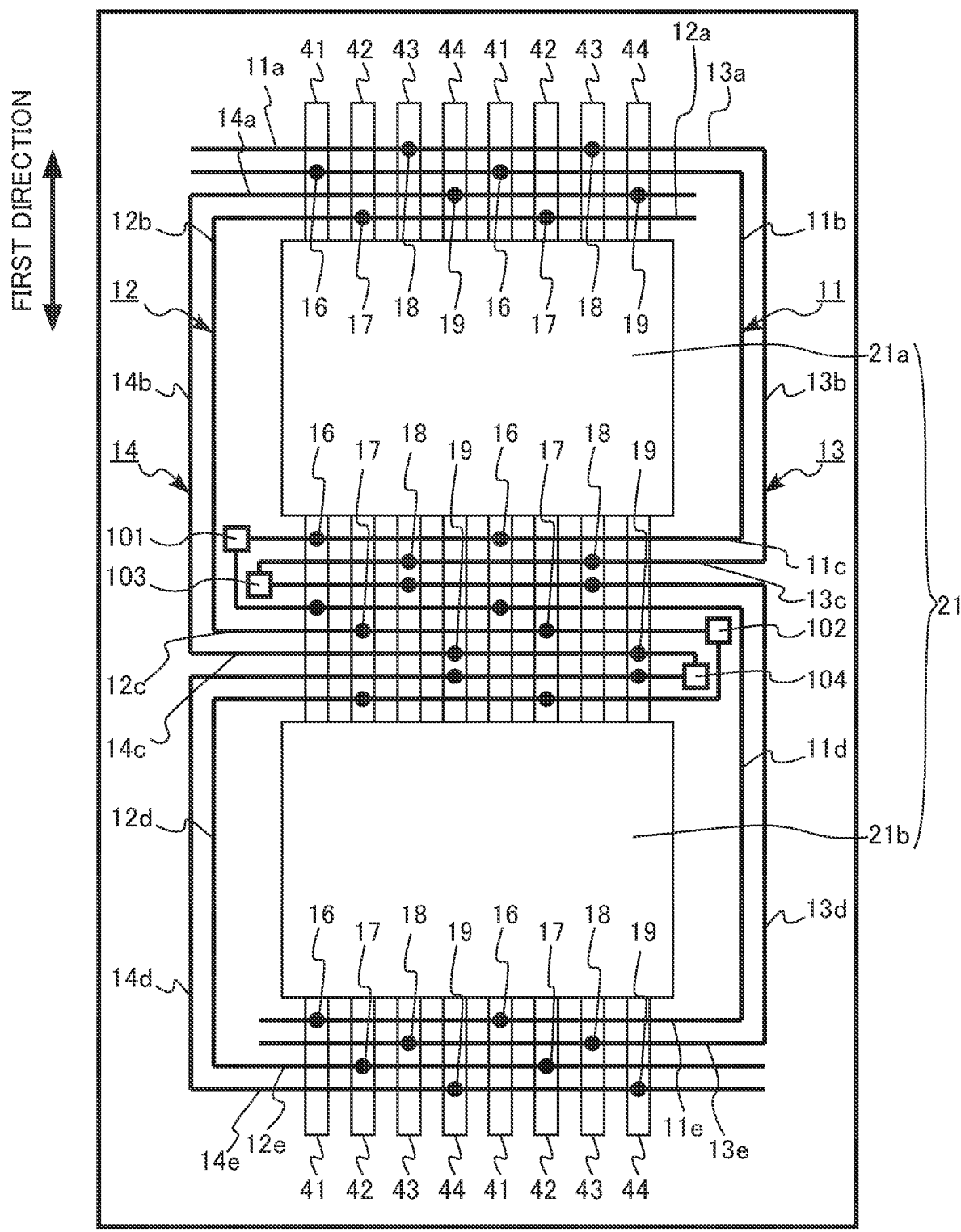
FIG. 13 is a schematic diagram of a semiconductor device according to a first modification of the fifth embodiment.

FIG. 13 is a schematic diagram of a semiconductor device according to a first modification of the fifth embodiment. The semiconductor device of the first modification is an IGBT 501. The IGBT 501 is different from the IGBT 500 of the fifth embodiment in the arrangement of the first gate electrode pad, the second gate electrode pad, the third gate electrode pad, and the fourth gate electrode pad.

Figure 14:
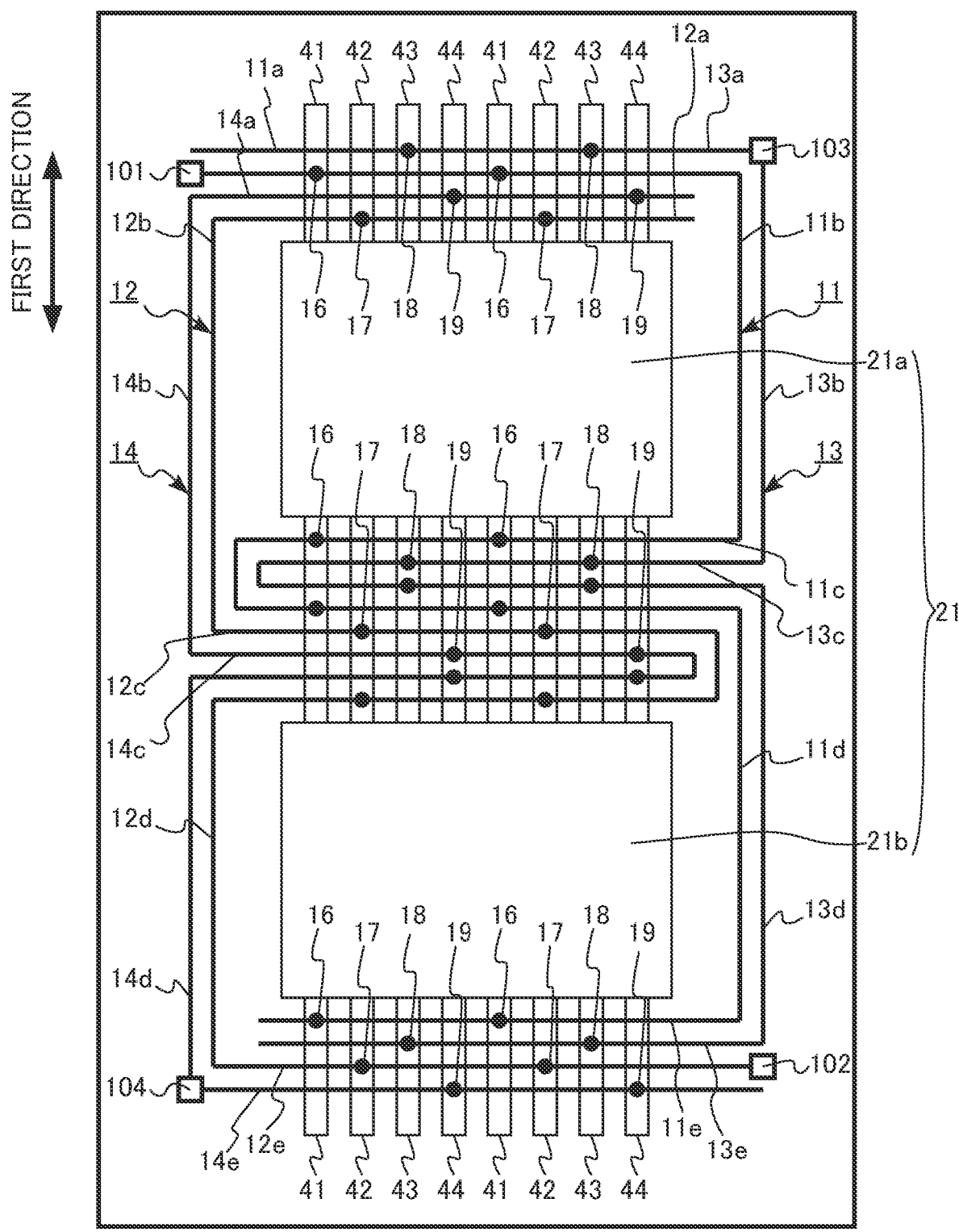
FIG. 14 is a schematic diagram of a semiconductor device according to a second modification of the fifth embodiment.

FIG. 14 is a schematic diagram of a semiconductor device according to a second modification of the fifth embodiment. The semiconductor device of the second modification is an IGBT 502. The IGBT 502 is different from the IGBT 500 of the fifth embodiment in the arrangement of the first gate electrode pad, the second gate electrode pad, the third gate electrode pad, and the fourth gate electrode pad.

As in the IGBT 501 of the first modification or the IGBT 502 of the second modification, for example, the first gate electrode pad, the second gate electrode pad, the third gate electrode pad, and the fourth gate electrode pad can be disposed at arbitrary positions required from the viewpoint of wire bonding.

As described above, according to the fifth embodiment, it is possible to provide an IGBT capable of realizing stable driving of a plurality of gates at low cost.

Sixth Embodiment

A semiconductor device of a sixth embodiment is different from the semiconductor device of the fifth embodiment in that shapes of a third gate wire and a fourth gate wire provided between a first region of a first electrode and a second region of the first electrode are different. Hereinafter, description of contents overlapping with those of the fifth embodiment may be partially omitted.

The semiconductor device of the sixth embodiment is a trench gate type IGBT 600 including a gate electrode in a trench formed in a semiconductor layer. The IGBT 600 is an IGBT having four gates independently controllable and capable of quad gate driving.

Figure 15:
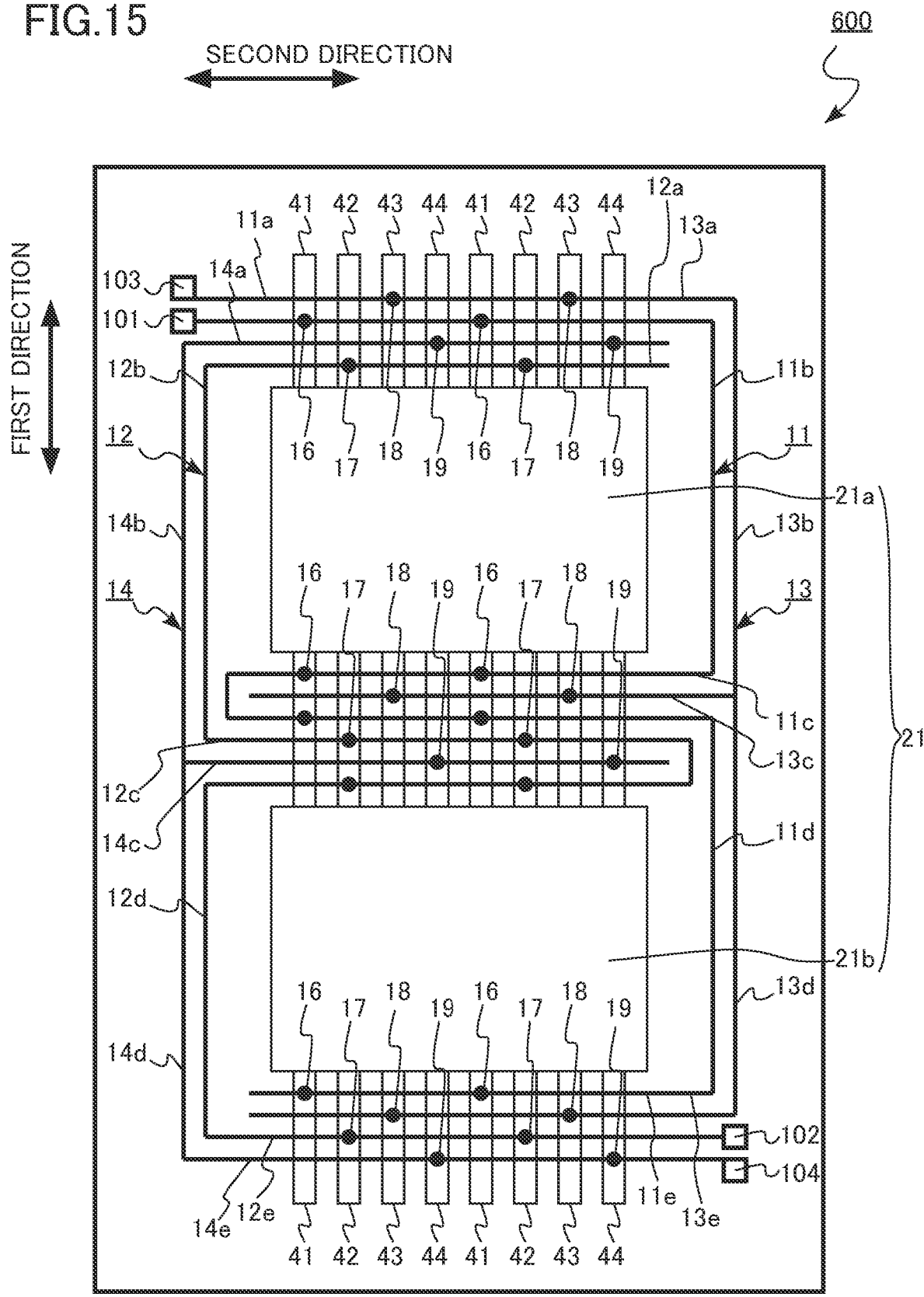
FIG. 15 is a schematic diagram of a semiconductor device according to a sixth embodiment.

FIG. 15 is a schematic diagram of the semiconductor device according to the sixth embodiment. FIG. 15 illustrates an arrangement and a connection relation of a first trench, a second trench, a third trench, a fourth trench, a first gate wire, a second gate wire, a third gate wire, a fourth gate wire, a first contact portion, a second contact portion, a third contact portion, a fourth contact portion, an emitter electrode, a first gate electrode pad, a second gate electrode pad, a third gate electrode pad, and a fourth gate electrode pad.

In the IGBT 600, a third portion 13c of a third gate wire 13 and a third portion 14c of a fourth gate wire 14 are provided between a first region 21a of an emitter electrode 21 and a second region 21b of the emitter electrode 21. A shape of the third portion 13c of the third gate wire 13 is not a folded shape like the IGBT 500 of the fifth embodiment, but a single line. In addition, a shape of the third portion 14c of the fourth gate wire 14 is also a single line.

In other words, in the IGBT 600, the shape of the third portion 13c of the third gate wire 13 and the shape of the third portion 14c of the fourth gate wire 14 between two transistor blocks are single lines.

In the IGBT 600, the shape of the third portion 13c of the third gate wire 13 and the shape of the third portion 14c of the fourth gate wire 14 between the two transistor blocks are configured as single lines, so that a distance between the two transistor blocks can be shortened. In the IGBT 600, a distance between the first region 21a of the emitter electrode 21 and the second region 21b of the emitter electrode 21 can be shortened.

Therefore, for example, a chip size can be reduced as compared with the IGBT 500 of the fifth embodiment.

As described above, according to the sixth embodiment, it is possible to provide an IGBT capable of realizing stable driving of a plurality of gates at low cost.

Seventh Embodiment

A semiconductor device of a seventh embodiment is different from the semiconductor device of the sixth embodiment in that a first electrode includes a third region and a length of a first region of the first electrode in a first direction is short. Hereinafter, description of contents overlapping with those of the sixth embodiment may be partially omitted.

The semiconductor device of the seventh embodiment is a trench gate type IGBT 700 including a gate electrode in a trench formed in a semiconductor layer. The IGBT 700 is an IGBT having four gates independently controllable and capable of quad gate driving.

Figure 16:
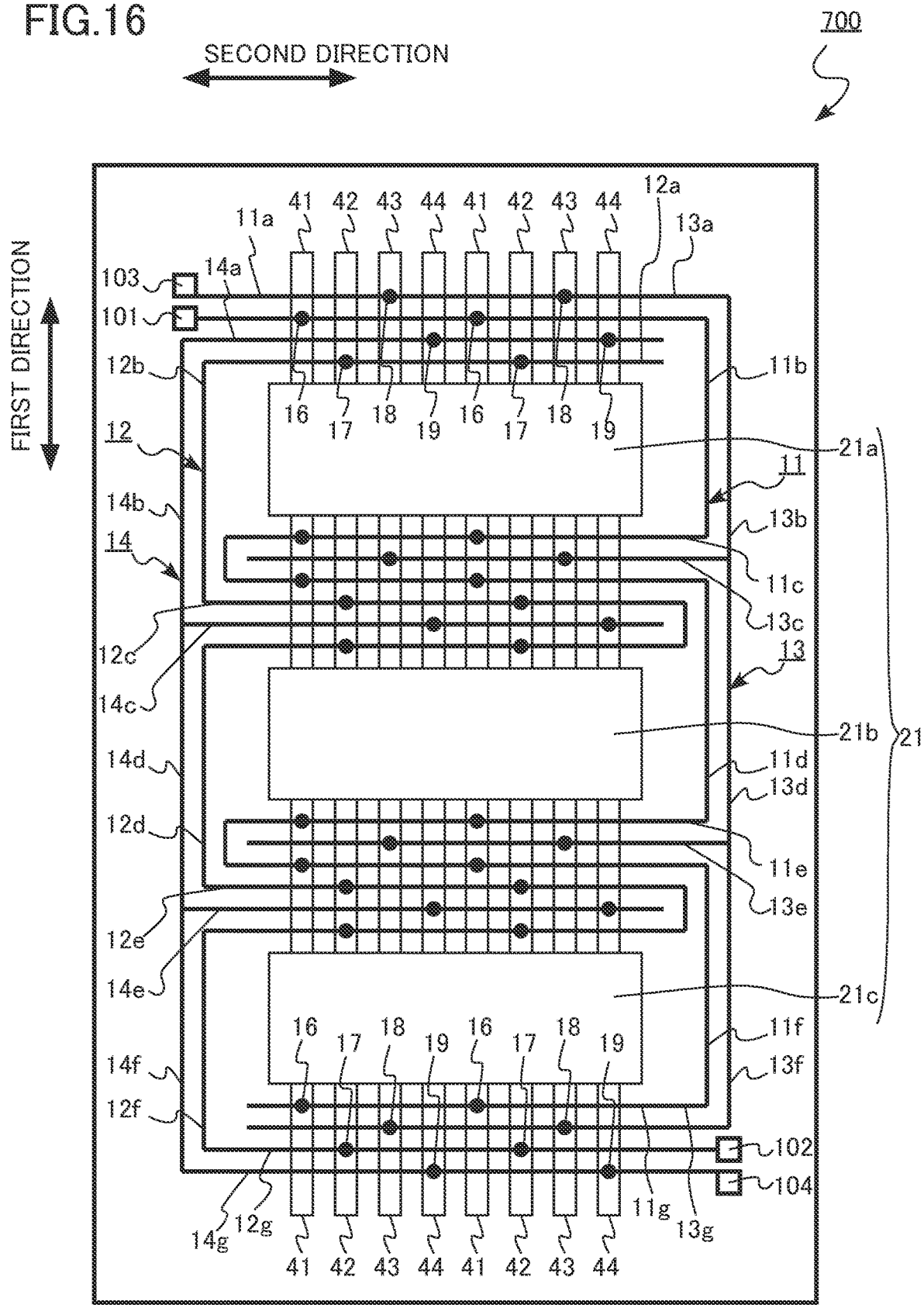
FIG. 16 is a schematic diagram of a semiconductor device according to a seventh embodiment.

FIG. 16 is a schematic diagram of the semiconductor device according to the seventh embodiment. FIG. 16 illustrates an arrangement and a connection relation of a first trench, a second trench, a third trench, a fourth trench, a first gate wire, a second gate wire, a third gate wire, a fourth gate wire, a first contact portion, a second contact portion, a third contact portion, a fourth contact portion, an emitter electrode, a first gate electrode pad, a second gate electrode pad, a third gate electrode pad, and a fourth gate electrode pad.

An emitter electrode 21 has a first region 21*a*, a second region 21*b*, and a third region 21*c*. The first region 21*a* and the second region 21*b* are spaced from each other in the first direction. The second region 21*b* and the third region 21*c* are spaced from each other in the first direction. The IGBT 700 has three transistor blocks of a transistor block including the first region 21*a*, a transistor block including the second region 21*b*, and a transistor block including the third region 21*c*.

A first gate wire 11 includes a first portion 11*a*, a second portion 11*b*, a third portion 11*c*, a fourth portion 11*d*, a fifth portion lie, a sixth portion 11*f*, and a seventh portion 11*g*. The first portion 11*a* extends in the second direction. The second portion 11*b* extends in the first direction. The third portion 11*c* extends in the second direction. The fourth portion 11*d* extends in the first direction. The fifth portion 11*e* extends in the second direction. The sixth portion 11*f* extends in the first direction. The seventh portion 11*g* extends in the second direction.

A second gate wire 12 includes a first portion 12*a*, a second portion 12*b*, a third portion 12*c*, a fourth portion 12*d*, a fifth portion 12*e*, a sixth portion 12*f*, and a seventh portion 12*g*. The first portion 12*a* extends in the second direction. The second portion 12*b* extends in the first direction. The third portion 12*c* extends in the second direction. The fourth portion 12*d* extends in the first direction. The fifth portion 12*e* extends in the second direction. The sixth portion 12*f* extends in the first direction. The seventh portion 12*g* extends in the second direction.

A third gate wire 13 includes a first portion 13*a*, a second portion 13*b*, a third portion 13*c*, a fourth portion 13*d*, a fifth portion 13*e*, a sixth portion 13*f*, and a seventh portion 13*g*. The first portion 13*a* extends in the second direction. The second portion 13*b* extends in the first direction. The third portion 13*c* extends in the second direction. The fourth portion 13*d* extends in the first direction. The fifth portion 13*e* extends in the second direction. The sixth portion 13*f* extends in the first direction. The seventh portion 13*g* extends in the second direction.

A fourth gate wire 14 includes a first portion 14*a*, a second portion 14*b*, a third portion 14*c*, a fourth portion 14*d*, a fifth portion 14*e*, a sixth portion 14*f*, and a seventh portion 14*g*. The first portion 14*a* extends in the second direction. The second portion 14*b* extends in the first direction. The third portion 14*c* extends in the second direction. The fourth portion 14*d* extends in the first direction. The fifth portion 14*e* extends in the second direction. The sixth portion 14*f* extends in the first direction. The seventh portion 14*g* extends in the second direction.

According to the IGBT 700 of the seventh embodiment, for example, as compared with the IGBT 600 of the sixth embodiment, the number of transistor blocks is increased, so that an IGBT having a large chip size can be realized. Further, according to the IGBT 700 of the seventh embodiment, for example, as compared with the IGBT 600 of the sixth embodiment, the length of the transistor block in the first direction is shortened, so that it is possible to realize an IGBT that suppresses a delay of a gate signal in the transistor block and further reduces switching loss.

In the seventh embodiment, the case where the number of transistor blocks is three has been described as an example, but the number of transistor blocks may be four or more. Even when the number of transistor blocks is four or more, the gate wire can be laid out without providing an additional insulating layer or an additional wiring layer.

As described above, according to the seventh embodiment, it is possible to provide an IGBT capable of realizing stable driving of a plurality of gates at low cost.

In the first to seventh embodiments, the case where the semiconductor device is an IGBT has been described as an example, but the present disclosure can also be applied to a case where the semiconductor device is a metal oxide semiconductor field effect transistor (MOSFET).

In the first to seventh embodiments, the case where the number of first to fourth trenches is two to four has been described as an example, but the number of first to fourth trenches may be five or more.

Further, the arrangement order of the first, second, third, and fourth trenches and the ratio of the number of respective trenches are arbitrary, and are not necessarily limited to the arrangement order and the ratio of the number in the first to seventh embodiments.

Further, the semiconductor device may be provided with a trench in which a conductive layer in the trench is not electrically connected to the gate wire. For example, the semiconductor device may be provided with a trench in which a conductive layer in the trench is electrically connected to the emitter electrode.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor layer having a first plane and a second plane facing the first plane, the semiconductor layer including a plurality of first trenches and a plurality of second trenches, the first trenches being provided in a first plane side and extending in a first direction parallel to the first plane, the second trenches being provided in the first plane side and extending in the first direction, and at least one of the second trenches being provided between the first trenches;
a first electrode provided on the first plane side of the semiconductor layer;
a second electrode provided on a second plane side of the semiconductor layer;
first gate electrodes provided in the first trenches;
second gate electrodes provided in the second trenches;
a first gate wire provided on the first plane side of the semiconductor layer, the first gate wire including a first portion extending in a second direction parallel to the first plane and perpendicular to the first direction, a second portion extending in the first direction, and a third portion extending in the second direction, and the first gate wire being electrically connected to the first gate electrodes;
a second gate wire provided on the first plane side of the semiconductor layer, the second gate wire including a first portion extending in the second direction, a second portion extending in the first direction, and a third portion extending in the second direction, and the second gate wire being electrically connected to the second gate electrodes;
a first gate electrode pad provided on the first plane side of the semiconductor layer and electrically connected to the first gate wire; and
a second gate electrode pad provided on the first plane side of the semiconductor layer and electrically connected to the second gate wire, wherein
the first portion of the second gate wire is provided between the first portion of the first gate wire and the third portion of the first gate wire, and
the third portion of the first gate wire is provided between the first portion of the second gate wire and the third portion of the second gate wire.

2. The semiconductor device according to claim 1, wherein
the first portion of the first gate wire is connected to the first gate electrodes at a portion where the first portion of the first gate wire and the first trenches intersect,
the third portion of the first gate wire is connected to the first gate electrodes at a portion where the third portion of the first gate wire and the first trenches intersect,
the first portion of the second gate wire is connected to the second gate electrodes at a portion where the first portion of the second gate wire and the second trenches intersect, and
the third portion of the second gate wire is connected to the second gate electrodes at a portion where the third portion of the second gate wire and the second trenches intersect.

3. The semiconductor device according to claim 1, wherein
the first electrode is provided between the first portion of the second gate wire and the third portion of the first gate wire, and
the first electrode is provided between the second portion of the first gate wire and the second portion of the second gate wire.

4. The semiconductor device according to claim 1, wherein
the first gate wire further includes a fourth portion extending in the first direction and a fifth portion extending in the second direction,
the second gate wire further includes a fourth portion extending in the first direction and a fifth portion extending in the second direction,
the third portion of the second gate wire is provided between the third portion of the first gate wire and the fifth portion of the first gate wire, and
the fifth portion of the first gate wire is provided between the third portion of the second gate wire and the fifth portion of the second gate wire.

5. The semiconductor device according to claim 4, wherein
the fifth portion of the first gate wire is connected to the first gate electrodes at a portion where the fifth portion of the first gate wire and the first trenches intersect, and
the fifth portion of the second gate wire is connected to the second gate electrodes at a portion where the fifth portion of the second gate wire and the second trenches intersect.

6. The semiconductor device according to claim 4, wherein
the first electrode includes a first region and a second region,
the first region is provided between the first portion of the second gate wire and the third portion of the first gate wire,
the first region is provided between the second portion of the first gate wire and the second portion of the second gate wire,
the second region is provided between the third portion of the second gate wire and the fifth portion of the first gate wire, and
the second region is provided between the fourth portion of the first gate wire and the fourth portion of the second gate wire.

7. The semiconductor device according to claim 1, wherein
the semiconductor layer further includes a plurality of third trenches provided in the first plane side and extending in the first direction,
the semiconductor device further comprises:
third gate electrodes provided in the third trenches;
a third gate wire including a first portion extending in the second direction, a second portion extending in the first direction, and a third portion extending in the second direction, the third gate wire being electrically connected to the third gate electrodes; and
a third gate electrode pad provided on the first plane side of the semiconductor layer and electrically connected to the third gate wire,
the first portion of the first gate wire is provided between the first portion of the third gate wire and the first portion of the second gate wire, and
the third portion of the third gate wire is provided between the third portion of the first gate wire and the third portion of the second gate wire.

8. The semiconductor device according to claim 7, wherein
the semiconductor layer further includes a plurality of fourth trenches provided in the first plane side and extending in the first direction,
the semiconductor device further comprises:
fourth gate electrodes provided in the fourth trenches;
a fourth gate wire including a first portion extending in the second direction, a second portion extending in the first direction, and a third portion extending in the second direction, the fourth gate wire being electrically connected to the fourth gate electrodes; and a fourth gate electrode pad provided on the first plane side of the semiconductor layer and electrically connected to the fourth gate wire, the first portion of the fourth gate wire is provided between the first portion of the first gate wire and the first portion of the second gate wire, and the third portion of the second gate wire is provided between the third portion of the third gate wire and the third portion of the fourth gate wire.

9. A semiconductor device comprising:

a semiconductor layer having a first plane and a second plane facing the first plane, the semiconductor layer including a plurality of first trenches and a plurality of second trenches, the first trenches being provided in a first plane side and extending in a first direction parallel to the first plane, the second trenches being provided in the first plane side and extending in the first direction, and at least one of the second trenches being provided between the first trenches;

a first electrode provided on the first plane side of the semiconductor layer;

a second electrode provided on a second plane side of the semiconductor layer;

first gate electrodes provided in the first trenches;

second gate electrodes provided in the second trenches;

a first gate wire provided on the first plane side of the semiconductor layer, the first gate wire including a first portion extending in a second direction parallel to the first plane and perpendicular to the first direction, a second portion extending in the first direction, a third portion extending in the second direction, a fourth portion extending in the first direction, and a fifth portion extending in the second direction, and the first gate wire being electrically connected to the first gate electrodes;

a second gate wire provided on the first plane side of the semiconductor layer, the second gate wire including a first portion extending in the second direction, a second portion extending in the first direction, a third portion extending in the second direction, a fourth portion extending in the first direction, and a fifth portion extending in the second direction, and the second gate wire being electrically connected to the second gate electrodes;

a first gate electrode pad provided on the first plane of the semiconductor layer and electrically connected to the first gate wire; and a second gate electrode pad provided on the first plane side of the semiconductor layer and electrically connected to the second gate wire, wherein the first portion of the second gate wire is provided between the first portion of the first gate wire and the third portion of the first gate wire, the third portion of the first gate wire is provided between the third portion of the second gate wire and the fifth portion of the first gate wire, and the fifth portion of the first gate wire is provided between the third portion of the second gate wire and the fifth portion of the second gate wire.

10. The semiconductor device according to claim 9, wherein the first portion of the first gate wire is connected to the first gate electrodes at a portion where the first portion of the first gate wire and the first trenches intersect, the third portion of the first gate wire is connected to the first gate electrodes at a portion where the third portion of the first gate wire and the first trenches intersect, the first portion of the second gate wire is connected to the second gate electrodes at a portion where the first portion of the second gate wire and the second trenches intersect, and the third portion of the second gate wire is connected to the second gate electrodes at a portion where the third portion of the second gate wire and the second trenches intersect.

11. The semiconductor device according to claim 9, wherein the first electrode is provided between the first portion of the second gate wire and the third portion of the first gate wire, and the first electrode is provided between the second portion of the first gate wire and the second portion of the second gate wire.

\* \* \* \* \*